United States Patent [19]

Seroussi et al.

[11] Patent Number: 5,389,922
[45] Date of Patent: Feb. 14, 1995

[54] COMPRESSION USING SMALL DICTIONARIES WITH APPLICATIONS TO NETWORK PACKETS

[75] Inventors: Gadiel Seroussi, Cupertino, Calif.; Abraham Lempel, Haifa, Israel

[73] Assignee: Hewlett-Packard Company, Palo Alto, Calif.

[21] Appl. No.: 46,548

[22] Filed: Apr. 13, 1993

[51] Int. Cl.$^6$ ............................................. H03M 7/30
[52] U.S. Cl. ...................................... 341/51; 341/106
[58] Field of Search ................ 341/51, 106, 52, 55, 341/87, 90, 94, 95

[56] References Cited

U.S. PATENT DOCUMENTS

| | | | |
|---|---|---|---|
| 4,464,650 | 8/1984 | E$astman et al. | 340/347 |
| 4,558,302 | 12/1985 | Welch | 340/347 |
| 4,814,746 | 3/1989 | Miller et al. | 341/95 |
| 5,003,307 | 3/1991 | Whiting et al. | 341/51 |
| 5,150,430 | 9/1992 | Chu | 341/51 X |

OTHER PUBLICATIONS

Bunton et al., "Practical Dictionary Management for Hardware Data Compression, Development of a Theme by Ziv and Lempel", Communications of the ACM, 35:95-104, Jan. 1992.
"On the Complexity of Finite Sequences", IEEE Transactions on Information Theory, IT-22:75-81, Jan. 1976.
"A Universal Algorithm for Sequential Data Compression", IEEE Transactions on Information Theory, IT-23:337-343, May 1977.
"Compression of Individual Sequences via Variable Rate Coding", IEEE Transactions on Information Theory, IT-24:530-536.
U.S. patent application Ser. No. 07/892,546, filing date Jun. 1, 1992, Lempel et al., "Lempeli-Ziv Compression Scheme with Enhanced Adaption".

*Primary Examiner*—Sharon D. Logan

[57] ABSTRACT

The invention is a dictionary initialization scheme adaptive to changes in the type and structure of input data. The compression ratio is increased by minimizing the number of data entries used to represent single characters in the input data. By using fewer codes than what is normally used to represent characters in an array of input data, the dictionary can have fewer entries than the alphabet size. A further aspect of the invention implements a type of run-length encoding in the LZ methodology which exploits the redundant structure existing in the compressed stream in the presence of a long run. Some of the codewords in the compressed stream are deleted but can be recovered at the decompression site. The foregoing LZE method is used alone, or used in combination with other methods to form a compression scheme that is especially useful for transmitting network packets.

23 Claims, 24 Drawing Sheets

| MAX BITS | DICT ENTRIES | 1. FULL m=8 | 2. EMPTY m=8 k=0 | 3. INTERM. m=8 k=5 | 4. EMPTY m=16 k=0 | 5. INTERM. m=16 k=7 |
|---|---|---|---|---|---|---|
| 6 | 64 | N/A | 0.816 | 0.733 | N/A | N/A |
| 7 | 128 | N/A | 0.745 | 0.677 | N/A | N/A |
| 8 | 256 | N/A | 0.659 | 0.620 | 0.782 | 0.709 |
| 9 | 512 | 0.606 | 0.578 | 0.553 | 0.668 | 0.606 |
| 10 | 1024 | 0.501 | 0.497 | 0.485 | 0.575 | 0.520 |
| 11 | 2048 | 0.447 | 0.450 | 0.442 | 0.508 | 0.467 |
| 12 | 4096 | 0.411 | 0.412 | 0.409 | 0.447 | 0.418 |
| 16 | 65536 | 0.330 | 0.331 | 0.331 | 0.344 | 0.334 |

Fig.10

FROM FIG.17A

INTERMEDIATE COMPRESSED DATA STREAM

| 13 | 1 | 33 | 34 | 35 | 36 | ... |

↙ 186

INTERMEDIATE INITIALIZATION/RUN LENGTH ENHANCEMENT COMPRESSED DATA STREAM

| 13 | 1 | 36 | 34 | ... |

↙ 188

DECOMPRESSED DATA STREAM

↙ 190

| $a_0$ | $a_1$ | $a_2$ | $a_3$ | $a_4$ | $a_5$ | $a_6$ | $a_7$ | $a_8$ | $a_9$ | $a_{10}$ | $a_{11}$ | b | ... |

Fig.17B

| BYTE VALUE | CODE LENGTH | BINARY CODE |
|---|---|---|
| 0 | $z$ | $\underbrace{00....00}_{z}$ |
| 1 TO $(2^z-2)2^{8-z}$ | 8 | $\underbrace{00...01}_{z}\underbrace{00...00}_{8-z}$ TO $\underbrace{11...10}_{z}\underbrace{11...11}_{8-z}$ |
| $(2^z-2)2^{8-z}+1$ | 8 | $\underbrace{11...11}_{z}\underbrace{00...00}_{8-z}$ |
| $(2^z-2)2^{8-z}+2$ TO $2^8-1$ | 9 | $\underbrace{11...1100...010}_{z}\underbrace{}_{9-z}$ TO $\underbrace{11...11}_{z}\underbrace{11...111}_{9-z}$ |

Fig.18A

| z | $p_z$ | APPROX. $p_z$ | APPROX. $R(z, p_z)$ |
|---|---|---|---|
| 0 | 1 | 1.0000 | 0.0000 |
| 1 | $\frac{128}{383}$ | 0.3342 | 0.7905 |
| 2 | $\frac{64}{319}$ | 0.2006 | 0.8989 |
| 3 | $\frac{32}{287}$ | 0.1115 | 0.9753 |
| 4 | $\frac{16}{271}$ | 0.0590 | 0.9843 |
| 5 | $\frac{8}{263}$ | 0.0304 | 0.9952 |
| 6 | $\frac{4}{259}$ | 0.0154 | 0.9990 |
| 7 | $\frac{2}{257}$ | 0.0078 | 1.0000 |
| 8 | $\frac{1}{256}$ | 0.0039 | 1.0000 |

Fig.19

| COMPRESSION METHOD | HPL FILE: 5000 PACKETS 1,993,542 BYTES AVG. PACKET LEN=399 | RND FILE: 1496 PACKETS 349,689 BYTES AVG. PACKET LEN=234 |
|---|---|---|
| UNIX COMPRESS ON WHOLE FILE (16 BITS) | 0.531 | 0.554 |
| UNIX COMPRESS ON WHOLE FILE (12 BITS) | 0.652 | 0.671 |
| LZE ALONE ON INDIVIDUAL PACKETS | 0.596 | 0.608 |
| LZE AND Z-HUF ON INDIVIDUAL PACKETS | 0.583 | 0.596 |

Fig. 21

COMPRESSION USING SMALL DICTIONARIES WITH APPLICATIONS TO NETWORK PACKETS

BACKGROUND OF INVENTION

This invention relates generally to compression and decompression of digital data and more particularly to implementations of lossless compression and decompression methods and apparatus using a dictionary to store compression data, and applications of compression/decompression techniques to network packet communications.

A major class of compression schemes encode multiple-character strings using binary sequences or "codewords" not otherwise used to encode individual characters. The strings are composed of an "alphabet," or single-character strings. This alphabet represents the smallest unique piece of information the compressor processes. Thus, an algorithm which uses eight bits, to represent its characters, has 256 unique characters in its alphabet. Compression is effective to the degree that the multiple-character strings represented in the encoding scheme are encountered in a given file of the data stream. By analogy with bilingual dictionaries used to translate between human languages, the device that embodies the mapping between uncompressed code and compressed code is commonly referred to as a "dictionary."

Generally, the usefulness of a dictionary-based compression scheme is dependent on the frequency with which the dictionary entries for multiple-character strings are used. If a fixed dictionary is optimized for one file type it is unlikely to be optimized for another. For example, a dictionary which includes a large number of character combinations likely to be found in newspaper text files, is unlikely to efficiently compress data base files, spreadsheet files, bit-mapped graphics files, computer-aided design files, et cetera.

Adaptive compression schemes are known in which the dictionary used to compress given input data is created while that input data is being compressed. Codewords representing every single character possible in the uncompressed input data are put into the dictionary. Additional entries are added to the dictionary as multiple-character strings are encountered in the file. The additional dictionary entries are used to encode subsequent occurrences of the multiple-character strings. For example, matching of current input patterns is attempted only against phrases currently residing in the dictionary. After each failed match, a new phrase is added to the dictionary. The new phrase is formed by extending the matched phrase by one symbol (e.g., the input symbol that "breaks" the match). Compression is effected to the extent that the multiple-character strings occurring most frequently in the file are encountered as the dictionary is developing.

During decompression, the dictionary is built in a like manner. Thus, when a codeword for a character string is encountered in the compressed file, the dictionary contains the necessary information to reconstruct the corresponding character string. Widely-used compression algorithms that use a dictionary to store compression and decompression information are the first and second methods of Lempel and Ziv, called LZ1 and LZ2 respectively. The Lempel-Ziv (LZ) algorithm was originally described by Lempel and Ziv in "On the Complexity of Finite Sequences" *IEEE Transactions on Information Theory*, IT-22:75-81, January 1976; and in "A Universal Algorithm for Sequential Data Compression" *IEEE Transactions on Information Theory*, IT-23:337-343, May 1977; and "Compression of Individual Sequences via Variable Rate Coding" *IEEE Transactions on Information Theory*, IT-24:530-536. Dictionary usage is also disclosed in U.S. Pat. No. 4,464,650 to Eastman et al., and various improvements in the algorithms are disclosed in U.S. Pat. Nos. 4,558,302 to Welch, and 4,814,746 to Miller et al.

When working on a practical implementation, the amount of memory available for compression/decompression is finite. Therefore, the number of entries in the dictionary is finite and the length of the codewords used to encode the entries is bounded. Typically, the length of codewords varies between 12 and 16 bits. When the input data sequence is sufficiently long, the dictionary will eventually "fill up." Several courses of action are possible at this point. For example, the dictionary can be frozen in its current state, and used for the remainder of the input sequence. In a second approach, the dictionary is reset and a new dictionary created from scratch. In a third approach, the dictionary is frozen for some time, until the compression ratio deteriorates, then the dictionary is reset. Alternate strategies for dictionary reset are described in U.S. application Ser. No. 07/892,546, filed Jun. 1, 1992 entitled "Lempel-Ziv Compression Scheme with Enhanced Adaptation", as is hereby incorporated by reference herein, and by Bunton, S. et al., in "Practical Dictionary Management for Hardware Data Compression" *Communications of the ACM*, 5:95-104, January 1992.

In the LZW process, the dictionary must be initialized for the single-character strings that are used to build the compression dictionary. These characters are assigned unique codes within the compression/decompression system. This implies that the number of bits in any additional output code sent out by the encoder (e.g., codes that represent multiple character strings) are controlled by the number of single-character strings. For example, the shortest bit length for a multiple character string is determined by the number of single-character strings. The number of bits in subsequent codes representing multiple characters, increase in length by one bit every time the number of entries in the dictionary reach the next power of 2. Using more bits to represent single-character codewords proportionally decreases the overall compression performance.

The initialization of single input characters as described above is inefficient for input data with a large alphabet size or when only an unknown subset of the alphabet is expected to occur in the input data. For example, when the "natural" alphabet for the input data consists of 16-bit symbols, the initial dictionary size would have 65,536 entries. Therefore, the minimal length of any output code generated, in addition to the characters from the "natural" alphabet (e.g., codes representing multi-character strings) is at least 17 bits. Alternatively, if the block of input data (i.e., the data to be compressed) is small relative to the alphabet size, there is an unnecessarily high overhead in time, memory space, and compression ratio that comes from initializing, storing, and encoding, respectively, single-character strings from the input data.

To overcome these problems, some variants of the LZ algorithm employ an empty initial dictionary. When a new input character is encountered, the compressor outputs a special code, followed by a copy of the new character. This allows the decompressor to keep track of a subset of the input alphabet that is actually in use, allowing decoding to proceed as usual. The main problem with this strategy is the high cost of encoding new characters. For short files over large alphabets, this overhead cost might become unacceptably high. For instance, with 8-bit symbols and 12-bit output codes, 20 bits are required to let the decoder know a new character has occurred. In addition, often there is redundancy within the encoded character strings output by the LZ algorithm. For example, a string of the same input characters (i.e., a "run") produces a sequence of encoded strings with a predictable and redundant structure. This redundancy is not presently leveraged to further increase the compression ratio of standard compression algorithms.

Accordingly, a need remains for a data compression initialization process that is adaptable to different types of input data and different data structures to increase the data compression ratio and to reduce the amount of memory required in a dictionary based compression/decompression system.

SUMMARY OF THE INVENTION

It is, therefore, an object of the invention to improve the compression and decompression of digital data in a dictionary-based system.

Another object of the invention is to increase the data compression ratio for compression/decompression schemes by reducing the number of bits used in representing encoded character strings.

Another object of the invention is to reduce the overhead of initializing a dictionary in a dictionary-based compression and decompression system.

A further object of the invention is to more efficiently compress digital data which either occurs in small files or which is represented by a subset of a large single-character alphabet.

A further object of the invention is to recompress encoded character strings that represent input data character runs to further increase the compression ratio of a compression/decompression system.

The invention is a dictionary based initialization scheme that is adaptive to changes in the type and structure of input data. The initialization scheme increases the compression ratio by minimizing the number of data entries used in a dictionary based compression/decompression system to represent single-character data strings. The reduced number of data entries reduces the bit-length of codewords in a compressed data string. Reducing the codeword bit-length in the compressed data string increases the overall compression ratio.

The invention uses a variable number of special codes. The total number of special codes is, typically, selected to be less than the total number of character codes used for representing single-characters in the input data array. Each special code carries part of the information on a new character. Additional bits, that further identify a new character, are then transmitted in a separate partial character. This process reduces the 'cost' (i.e., bandwidth and storage space) of transmitting a new symbol. The process is adaptable anywhere between a no initialization process (e.g., empty initial dictionary) to a full alphabet initialization where each unique character in the alphabet is assigned an entry in the dictionary.

The number of special codes is adaptable to the application presently being performed. Thus, the number of special codes is predetermined for specific types of data to maximize the compression ratio. This method allows the dictionary to have fewer entries than the alphabet size. Thus, compression is possible with very small dictionaries, that require very little memory. This is particularly useful in applications where the input data blocks are short, and each block has to be compressed independently. The initialization scheme also provides compression of data sources with large alphabet sizes (e.g., 16-bit symbols), while maintaining moderate size dictionaries.

A further aspect of the invention implements a type of run-length encoding in the LZ methodology (LZE). In conventional LZ2 data compression, a run, which is a string of repeated occurrences of the same character in the input data, is encoded as a series of codes. Each successive code is built upon the previous code, followed by a code for the remainder or tail of the run. The decompressor then receives and decodes each of these codes in sequential order. The system sends a shortened sequence by transmitting a single code (representing most of the character run) and the proceeding and tail codes.

The foregoing LZE method is used alone, or in combination with other methods to form a compression scheme especially useful in transmitting network packets. In the combined system, the LZE compression scheme is applied to an input data stream in parallel with one or more other data compression methods. For example, a Huffman variable-length coding scheme or an uncompressed transmission scheme. The output of the method providing the best compression ratio is then used for data transmission and storage. A high compression ratio is obtained for real network packet data containing packets with a wide distribution of lengths. The high compression ratio is consistently maintained across the entire range of packet lengths even in data having a large proportion of short packets.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIG. 10 is a table showing the compression results for different initialization schemes according to the present invention.

FIGS. 17A and 17B are a graphical depiction of the method for performing intermediate initialization and run length encoding.

FIG. 18A is a table illustrating optimal Huffman coded assignments.

FIG. 19 is a table showing probability distributions for different bit lengths.

FIG. 21 is a table showing compression results for various network packet files.

DETAILED DESCRIPTION

Figure 1:
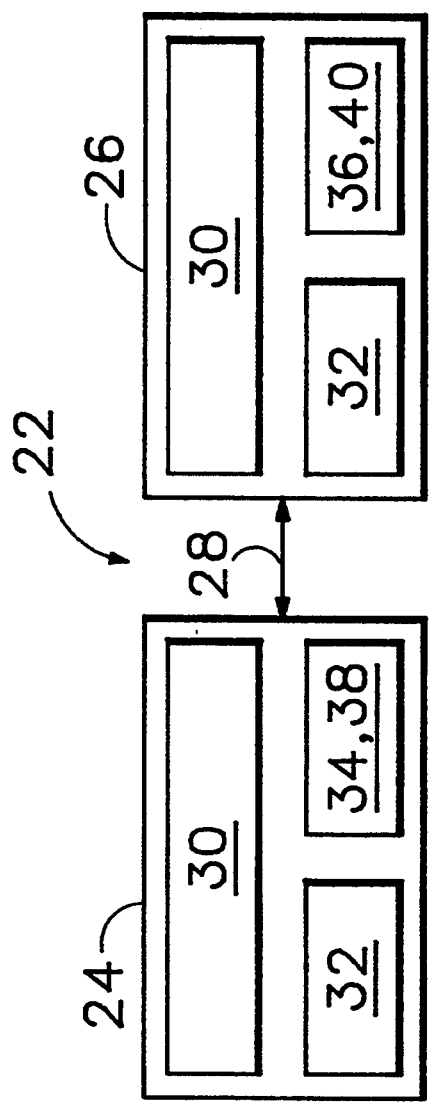
FIG. 1 is a generalized block diagram of a compression/decompression system in which the enhancements of the present invention are implemented.
Figure 2:
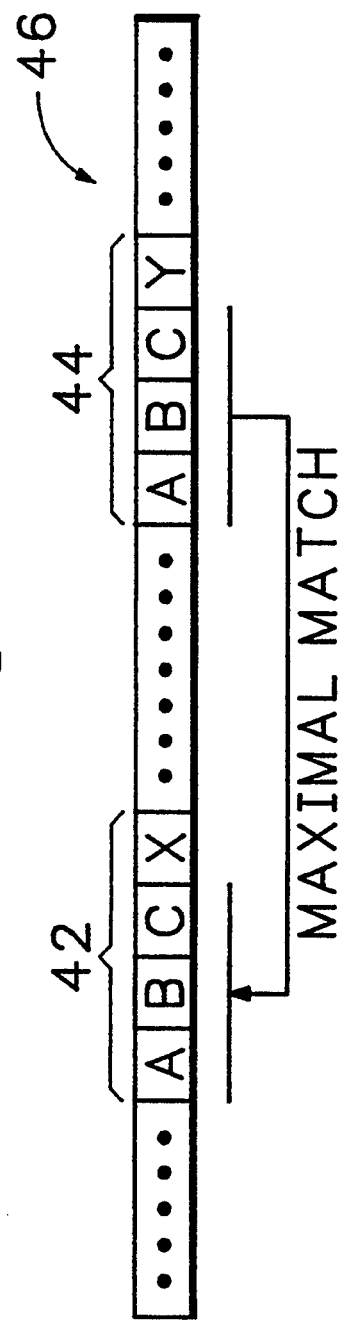
FIG. 2 is a diagram illustrating the basic principle of LZ compression.

The general arrangement and operation of Lempel-Ziv compression/decompression systems are well-known and are, therefore, described only in general terms with reference to FIGS. 1 and 2. The system 22 in FIG. 1 includes a compression subsystem 24 and a decompression subsystem 26 interconnected by a digital data communications (or storage) channel 28. In practice, both terminals of a system will include both compression and decompression subsystems and the hardware is typically designed to operate interchangeably to compress/send or to receive/decompress data.

Figure 12:
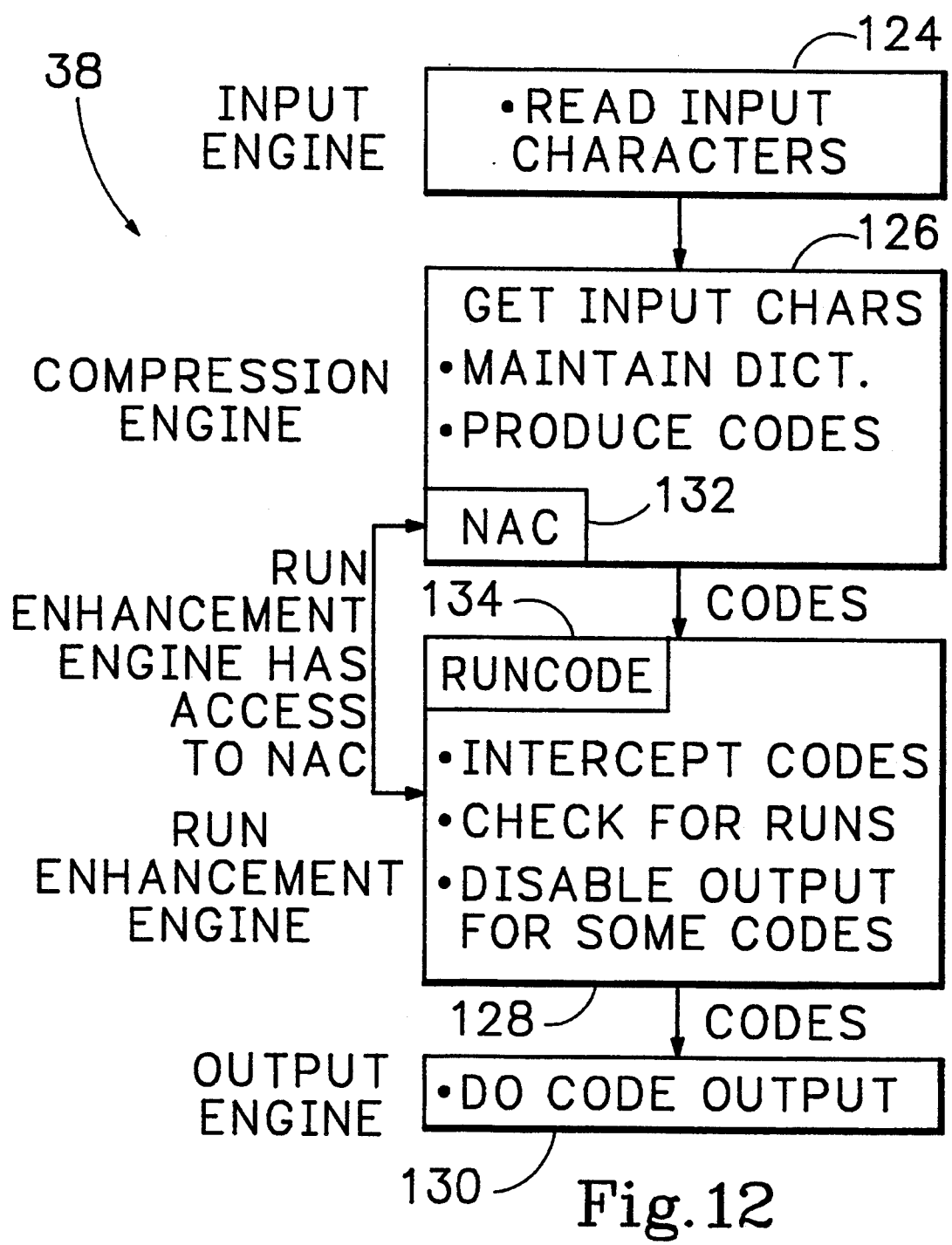
FIG. 12 is a block diagram of circuitry for implementing an enhanced Lempel-Ziv run-length encoding scheme in the compression subsystem shown in FIG. 1.
Figure 15:
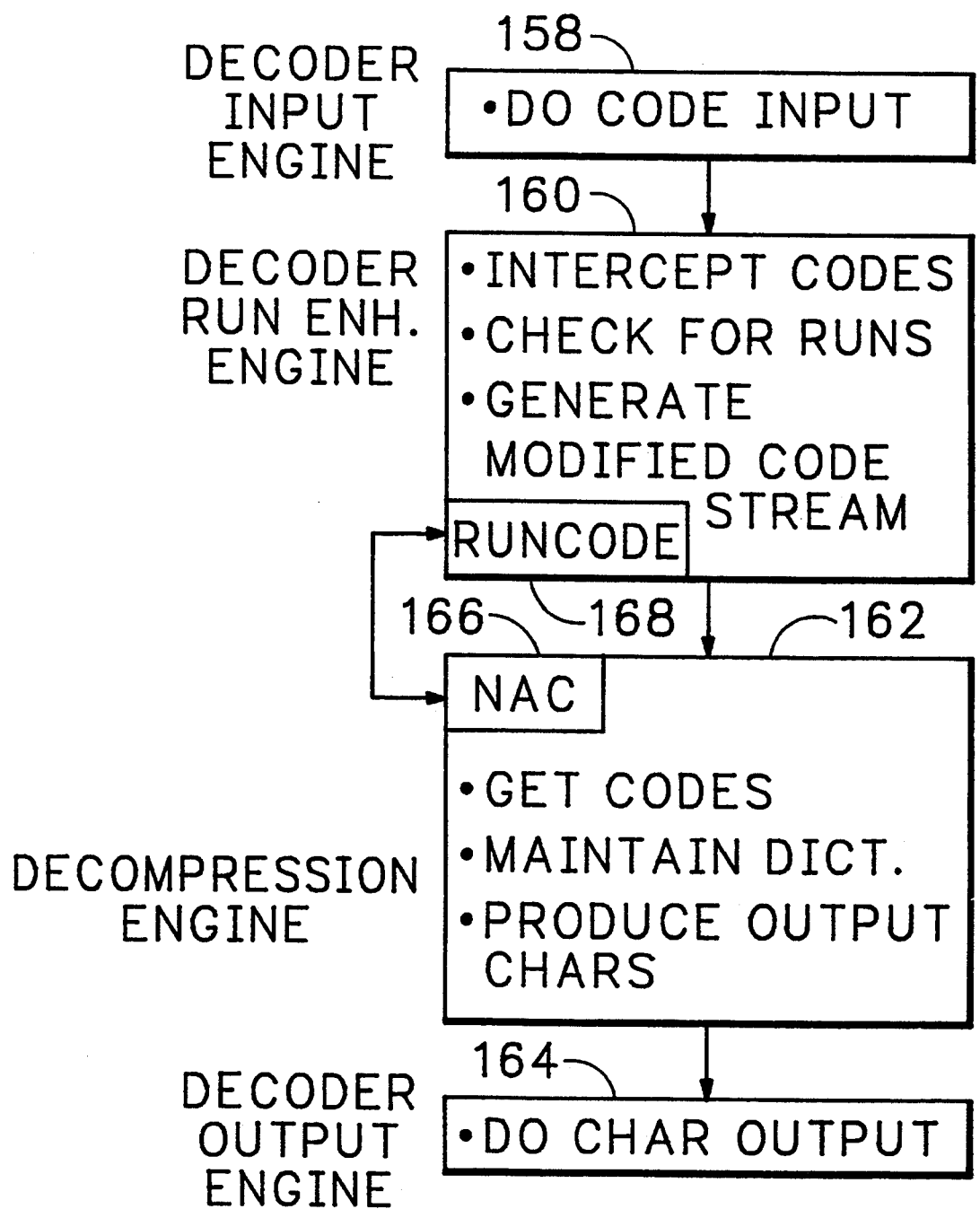
FIG. 15 is a block diagram of circuitry for implementing enhanced Lempel-Ziv run-length decoding in the decompression subsystem of FIG. 1 according to the invention.

Each subsystem includes, in addition to conventional communications (or storage) circuitry (not shown), a compression engine 30 which implements the basic Lempel-Ziv compression algorithm, memory 32 implementing one or more dictionaries in which data entries encoding the character string data are stored, and supporting circuits implementing the enhancements further described below. The supporting circuits include the intermediate initialization encoder 34 and counterpart decoder 36, which are further detailed in FIGS. 7 and 9, and the encoder run enhancement engine 38 and counterpart decoder run enhancement engine 40 which are shown in FIGS. 12 and 15.

FIG. 2 illustrates the Lempel-Ziv (LZ) algorithm, for lossless compression of digital data (i.e., the original data is completely recoverable from its compressed image). The LZ method matches a current pattern in an input data stream to patterns occurring previously. For example, a current pattern 42 (ABC) in input stream 46 is the same as a pattern 44 (ABC) that was previously transmitted. The compression subsystem 24 (FIG. 1), substitutes a description (i.e., codeword) of the maximal match for the matched input symbols (ABC). The decompression subsystem 26 (FIG. 1) can then reconstruct the original symbols from the match codeword, and from previously decompressed data segments. In redundant data sources, the descriptions or the codewords describing a multiple character match tend to be shorter than the matched patterns, thus achieving data compression.

The main feature of LZ2 is incremental parsing. The input data sequence is parsed into phrases, which are collected in a dictionary. Maximal matching of current input patterns is attempted, as described above, only against phrases in the dictionary. After each match, a new phrase is formed by extending the matched phrase with the input symbol that "breaks" the match. This and other variants of the algorithm, are asymptotically optimal, (i.e., achieve, in the limit, the best compression ratio theoretically possible). The algorithm is also highly adaptive, learning the statistical characteristics of the input data "on the fly". In LZ2, this "knowledge" is stored in the dictionary, whose entries parse the input data sequence.

The compressor implementation in LZ2 can be informally described as follows:

1. A dictionary is initialized with all single-letter words that exist in the input alphabet (e.g. the 256 one-byte strings) and a distinct index codeword is then assigned to each single-letter word.

2. A current phrase is initialized with the first character from an input data stream.

3. Characters from the input data stream are continuously read, extending the current phrase, as long as a matching phrase exists in the dictionary.

4. The process is stopped when the current phrase is of the form wa, where "a" is the last character read from the input data stream, W is a phrase in the dictionary, while Wa does not match an entry in the phrase dictionary.

5. The codeword for W is output.

6. Wa is added to the dictionary, assigning it the next available codeword.

7. The current phrase is set to "a" and the process returned to Step 3.

This implementation is known as LZW.

In the decompressor subsystem 26 in FIG. 1, a similar phrase dictionary is built. The decompressor is first initialized as in Step 1 above and new phrases are then added to the dictionary as the data is being decompressed. When the decompressor receives a code for a phrase W followed by the code for a phrase starting with the character "a", it adds the phrase Wa to the dictionary and assigns it the next available code. Thus, the decompressor can reconstruct the dictionary built by the compressor, without the latter having to send the dictionary along with the compressed data.

In a practical implementation, the amount of memory available to the encoder (and similarly to the decoder) is limited. Therefore, the number of phrases in the dictionary is also limited, and the output codes are of bounded length. Typically, the upper bound on the code length is between 12 and 16 bits. When the input data sequence is sufficiently long, the dictionary will eventually "fill up". At this point, the LZW dictionary is either "frozen" or "reinitialized".

Step 1 in the above outlined LZW compression procedure calls for the initialization of the dictionary with all single-character strings. Let m denote the size, in bits, of the single characters from the input data string (e.g., m=8, or one byte, in the most common case). The initial phrases in the dictionary are assigned codes $c_0$, $c_0+1$, $c_0+2, \ldots, c_030$ ($2^m-1$), for some initial non-negative number $c_0$. This implies that the first code sent out by the encoder (i.e., the first code representing a multiple character string) must be at least m+1 bits long. In practical implementations, it is customary to use output codes of length m+1 at the beginning of the compression process, and subsequently increase the length of the output codes by one bit every time the number of entries in the dictionary reaches the next power of 2. Hence, the length of the output codes vary between m+1 and b, where $2^b$ is the maximum size of the dictionary, and b$>$=m+1. For simplicity, it is assumed that the maximum dictionary size is a power of 2. This is the case in most practical implementations, although it is not a necessary requirement. Clearly, the length of the output codes directly impact the compression ratio. Specifically, the shorter the output codes, the better the compression ratio.

The initialization in Step 1 above works well in many applications, however, it is inefficient in applications where the alphabet size is large. This initialization process is also inefficient if only an unknown subset of the input alphabet is expected to occur in the data to be compressed. For example, in an application where the "natural" alphabet for the input data consists of 16-bit symbols, the initial dictionary size has 65,536 entries, and the minimal length of an output code is 17 bits. In an application where the block of data to be compressed is small relative to the alphabet size, it is often unnecessary to encode each potential single-character string.

Figure 3:
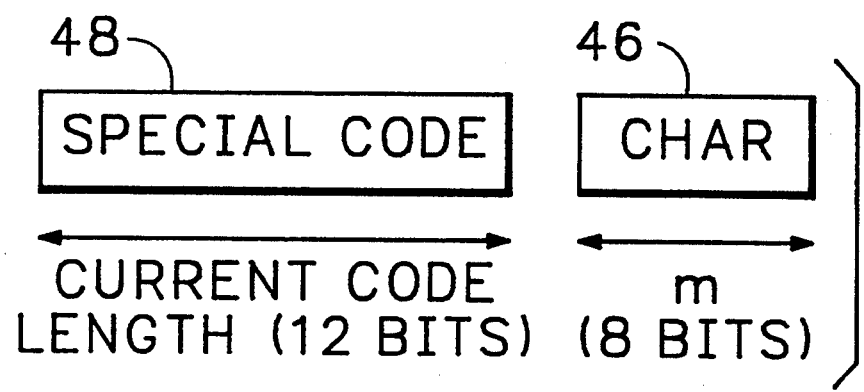
FIG. 3 is a diagram illustrating the transmission of a new character in conventional LZ compression with an empty initial dictionary.

To overcome these problems, some variations of the LZ algorithm employ an empty initial dictionary. When a new input character is encountered, the compressor outputs a special code, followed by a copy of the new character. In this method, the decompressor keeps track of the subset of the input alphabet that is actually in use, and decoding proceeds as usual. The main problem with this process is the high cost of encoding new characters. For short files over large alphabets, this overhead cost becomes unacceptably high. For example, in FIG. 3 both a character code 46 and a special code 48, are required to indicate to the decompressor engine 30 (FIG. 1) which new character has occurred. Assuming an 8-bit character length and a 12-bit current code length, a total of 20 bits must be transmitted to the decoder to identify each new character.

Intermediate Dictionary Initialization

Figure 4:
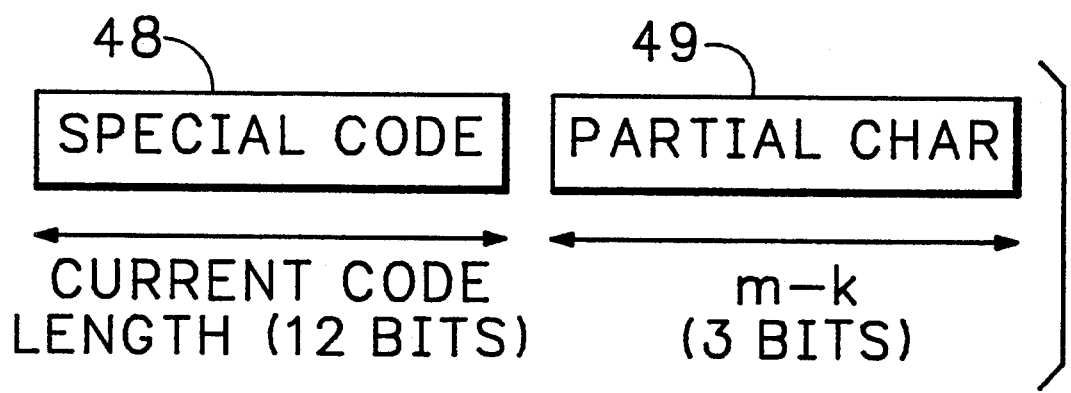
FIG. 4 is a diagram illustrating the transmission of a new character with enhanced LZ compression using intermediate dictionary initialization according to the invention.

To eliminate the bit length and memory problems stated above, $2^k$ different special codes $c_0$, $c_0+1$, $c_0+2, \ldots, c_0+(2^k-1)$ are used where $0<=k<=m$. This assumes the numbers $0, 1, \ldots, c_0-1$ are used for other control codes. In this manner, a special code carries k bits of information on the new character, and exactly m-k additional bits are needed to identify the new character. This is shown in FIG. 4 with k=5. The current code length for a special code 48 is 12 bits and a partial character code 49 has a length of 3 bits (i.e., m-k=8-5=3). Thus, the 'cost' of transmitting a new single-character string is reduced from 20 bits to 15 bits. When k=0, the method reduces to an empty initialization, and when k=m, the system operates as a full alphabet initialization (i.e., each character in the alphabet is represented by a codeword).

Figure 5:
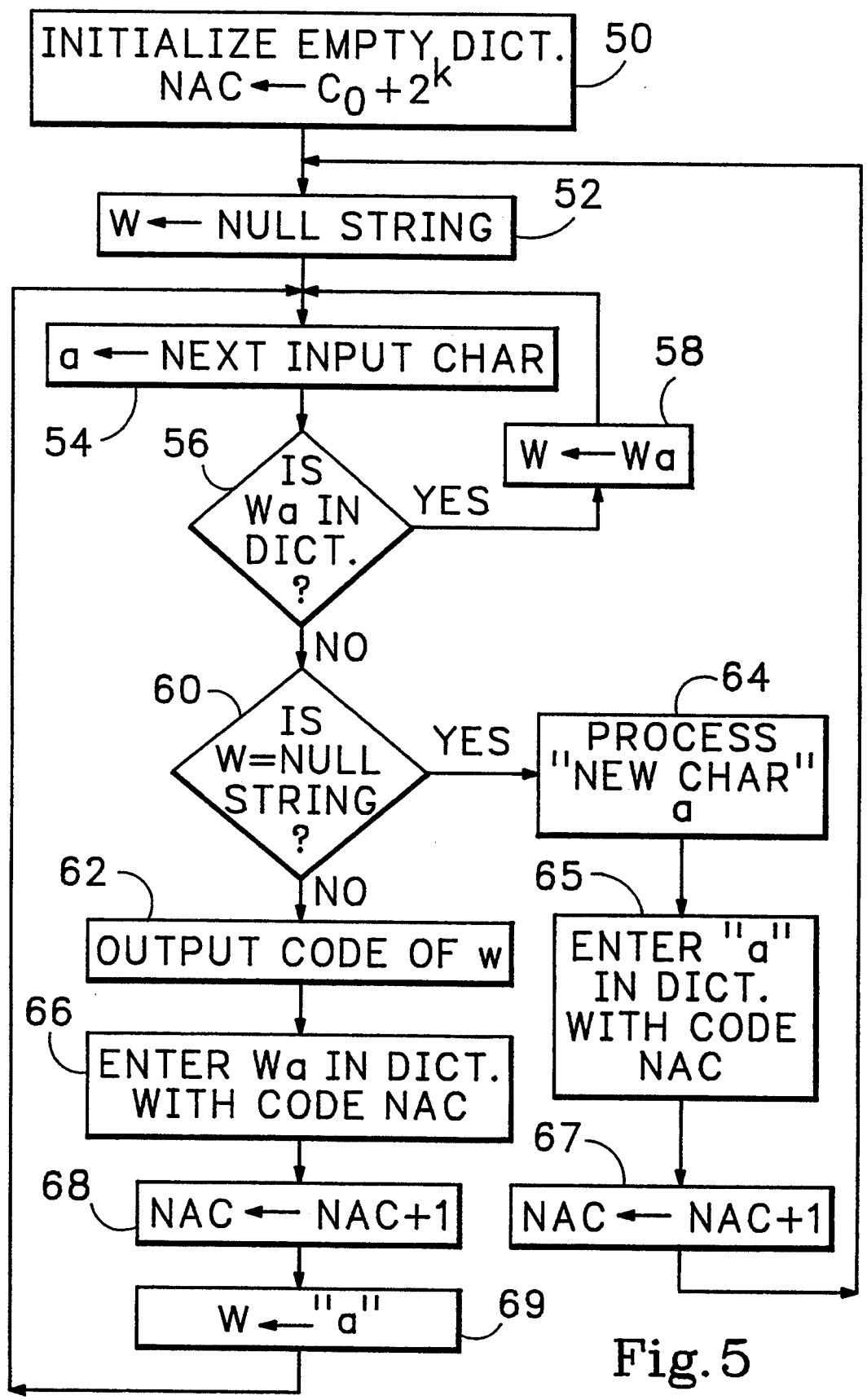
FIG. 5 is a flow chart of the basic LZE intermediate initialization process.

Referring to FIG. 5, operation according to the invention begins with an empty initial dictionary, and proceeds generally in accordance with the LZ algorithm modified as next described. Operation is initialized at block 50 by setting the next available code (NAC) to the value $c_0+2^k$. In the next step, block 52, a null string is set as the current phrase W. Then, at block 54, the next input character is input as "a". The step in block 56 queries whether the string Wa is already stored in the dictionary. If so, block 58 sets W equal to Wa and returns to block 54. This process repeats as long as a match is found in the dictionary, which is Conventional in the Lempel-Ziv methodology.

If Wa is not found in the dictionary, then block 60 queries whether W is a null string. If it is not, compression proceeds through blocks 62, 66, and 68 as in traditional LZW. Block 62 outputs the code for W and block 66 stores the encoded string Wa as a data entry in the dictionary at address location NAC. Block 68 increments NAC by one and "a" serves as the next value of W. The process then returns to block 54.

If decision block 60 determines that w is a null string, it is assumed that the input character "a" is a new character. The compressor then proceeds to the Process "New Char" block 64, which is a subprocess further described below with reference to FIG. 6. Upon returning from the "New Char" process, the input char "a" is entered into the dictionary at address location NAC in block 65. NAC is then incremented in block 67 and the process returns to block 52.

Figure 6:
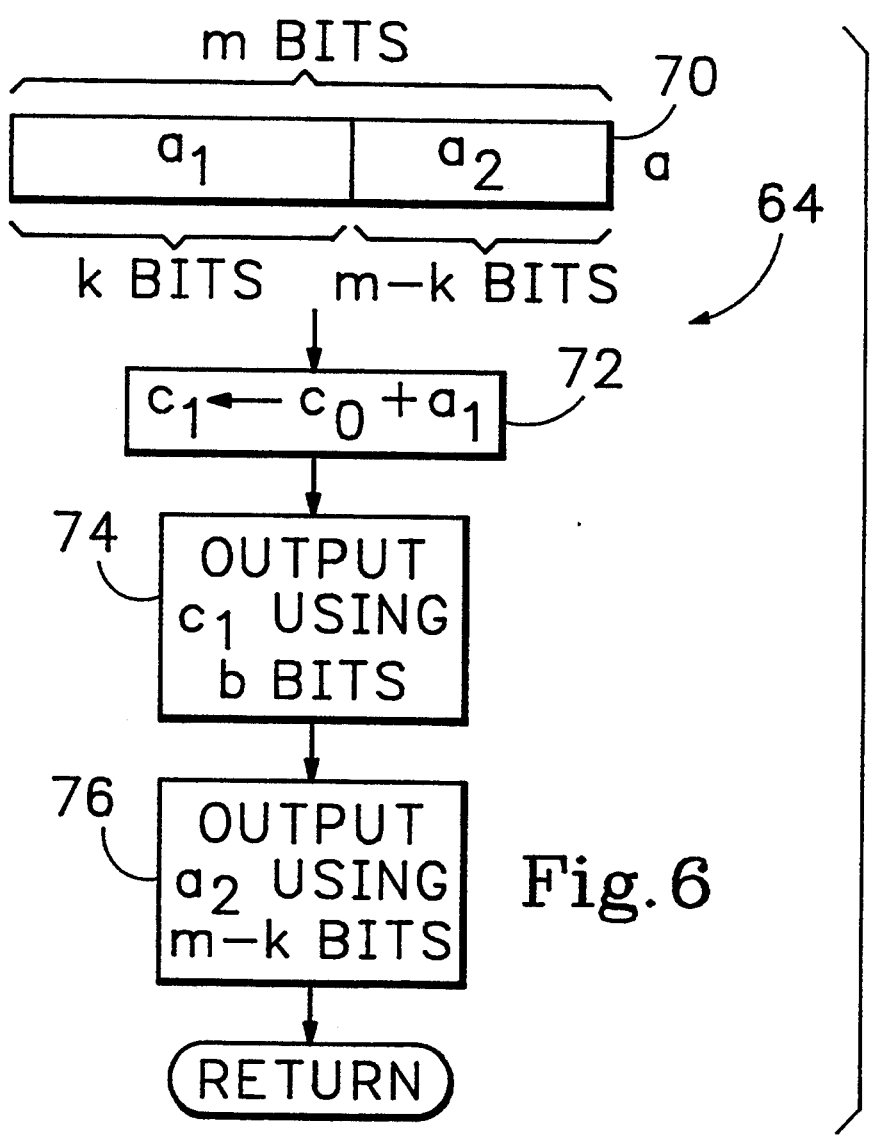
FIG. 6 is a flow chart of the "new character" encoding subprocess of FIG. 5.

Turning to FIG. 6, in subprocess 64 (see FIG. 5), the first step shown in block 70 is to divide the new character a, consisting of m bits, into two parts, $a_1$ consisting of k bits and $a_2$ consisting of m-k bits. Then, block 72 sets $c_1$ to the value $c_0+a_1$. Next, block 74 outputs $c_1$ using b bits and block 76 outputs $a_2$ using m-k bits. Here, b is the number of bits currently being used for output codewords. Then the subprocess returns to FIG. 5 at block 65.

Figure 7:
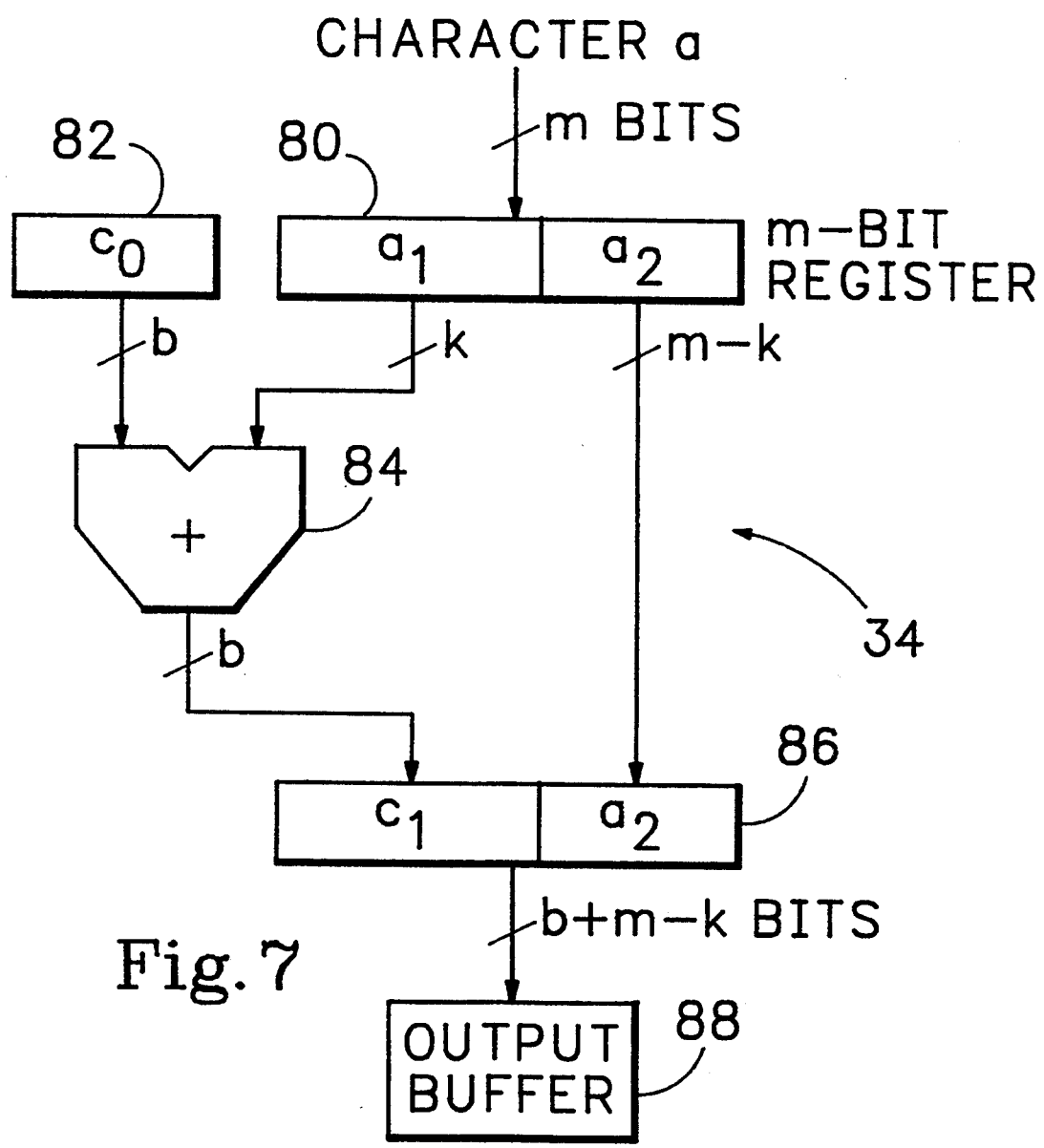
FIG. 7 is a functional block diagram of circuitry for implementing the encoding subprocess of FIG. 6 in the compression subsystem of FIG. 1.

FIG. 7 shows a circuit 34 (see FIG. 1) for hardware implementation of the subprocess of FIG. 6. Character a is input to an m-bit register 80 in which the character is stored in two parts, $a_1$ consisting of k bits and $a_2$ consisting of m-k bits. The value $c_0$ is stored in a b-bit register 82 and is output to adder 84 together with $a_1$ to form the b-bit sum $c_1=c_0+a_1$. This sum is placed in the first b bits of register 86 and concatenated with $a_2$ in the lower m-k bits of register 86. The resulting sequence of b+m−k bits is shifted to an output buffer 88 for insertion in the compressed stream (transmission to the decompression system).

Figure 8:
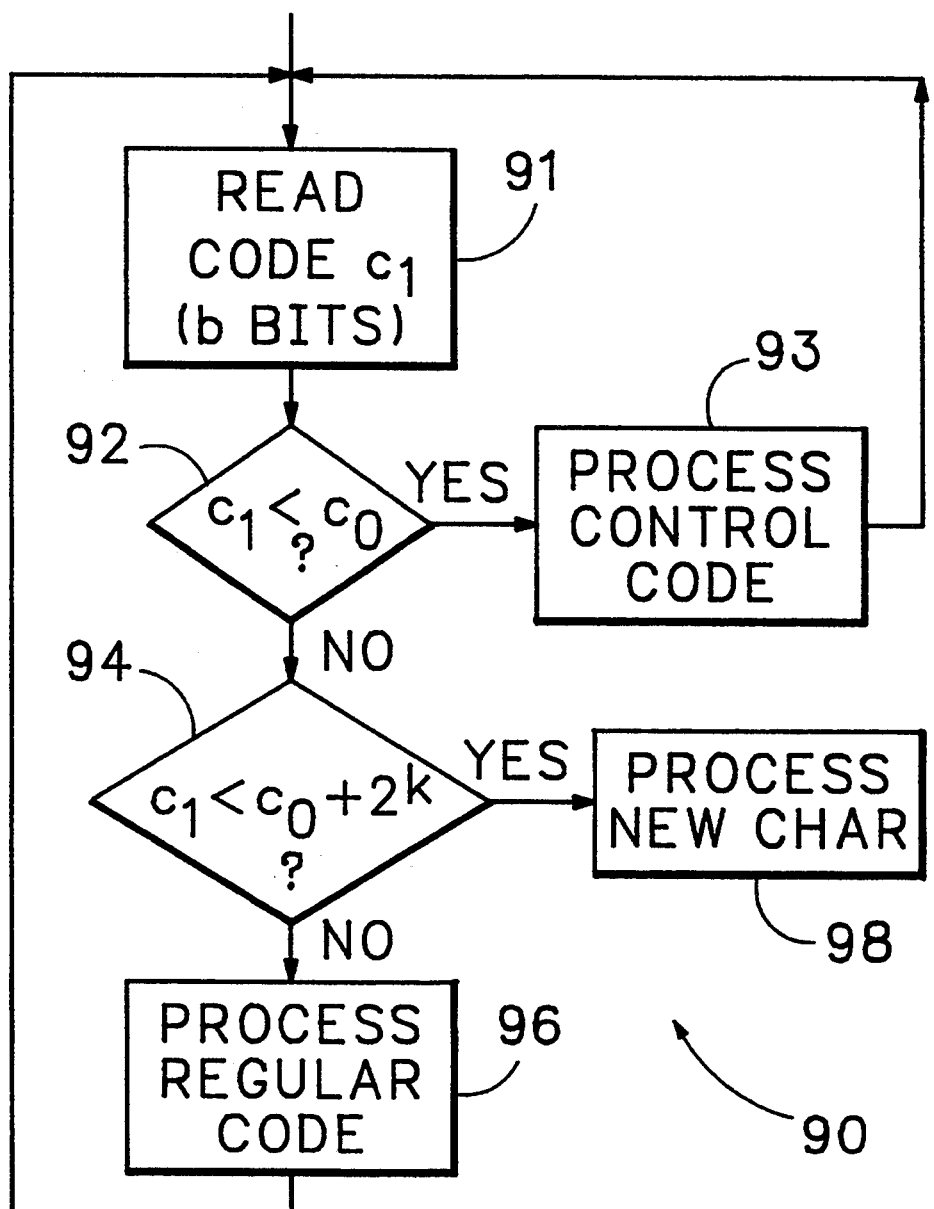
FIG. 8 is a flow chart of a "new character" decoding subprocess for decoding codes produced by the subprocess of FIG. 6.

FIG. 8 shows the decompression process 90, which commences at block 91 by reading the special code $c_1$ of b bits and then querying at block 92 whether the code $c_1$ is less than $c_0$. If so, block 93 treats the code $c_1$ as a process control code and returns to block 91. Otherwise, the process proceeds to query, at block 94, whether code $c_1$ is less than $c_0+2^k$. If it is not, the routine moves to block 96 to process the code $c_1$ as a regular LZ code, and then returns to block 91. Otherwise, the code $c_1$ is considered to be a code for a new character and the routine moves to block 98 where the special code $c_1$ and the associated partial character code $a_2$ are processed as a new character (the pair $c_1$, $a_2$ was output by the compressor in the circuitry of FIG. 7).

Figure 9:
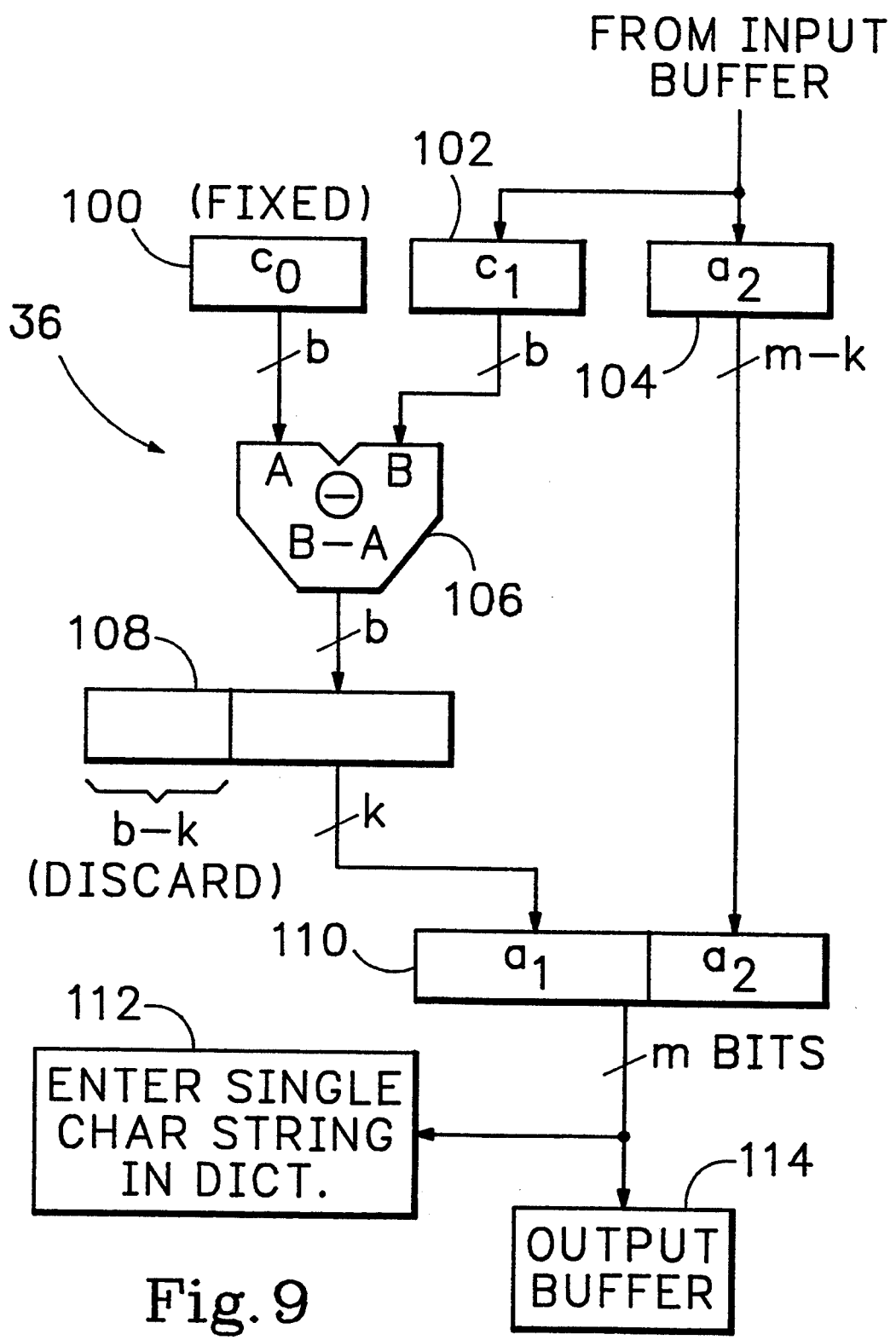
FIG. 9 is a functional block diagram of circuitry for implementing the decoding subprocess of FIG. 8 in the decompression subsystem of FIG. 1.

FIG. 9 shows the circuit 36 (FIG. 1), which implements in hardware the subprocess 98 of FIG. 8. The special code $c_1$ and partial character code $a_2$ are received from an input buffer (not shown) into registers 102 and 104, respectively. The contents of a fixed value $c_0$ in register 100 is subtracted from the contents of register 102 in subtractor 106. The b-bit result is contained in register 108 and the most significant b-k bits of register 108 are discarded. The least significant k-bits of register 108 are stored in the $a_1$ field of register 110 and concatenated with the partial character code $a_2$ from register 104. The contents of register 110 are entered as a single-character string into the dictionary in block 112 and loaded into an output buffer 114.

The number of special codes (or, equivalently, the parameter k) can be tuned to the application at hand. Experimental results indicate that for a wide range of input files, best compression is attained with values of k close to m/2. In particular, the values k=5 for m=8 and k=7 for m=16 were experimentally determined as optimal. Note that the initial code length for multi-character strings will only be k+1 bits instead of the typical m+1 bits. The method, therefore, allows for a dictionary which is smaller than the alphabet size and for codewords that are shorter than the input characters.

Thus, compression is possible with very small dictionaries, requiring very little memory. This method is particularly attractive for applications where the input data blocks are short, and each block has to be compressed independently. On the other end of the spectrum, the method allows for compression of sources with large alphabet sizes (e.g., 16-bit symbols), while maintaining moderate size dictionaries.

Assume m=8, k=5, and $c_0$=3, and that the new character to be transmitted has binary representation 01101010. The first k bits of the character are 01101, representing the number 13. Hence, the special code transmitted is $c_0$+13=16. This code is transmitted using the current code length. In addition, the m-k=3 remaining bits, 010, are transmitted "as is" following the special code as partial character code $a_2$. Assuming that the current code length is 12 bits, the resulting binary output is [000000010000] for the special code and [010] for the character code.

FIG. 10 shows the compression results from various character and special code bit lengths. The input file for all the compression experiments was obtained by concatenating together (using the UNIX tar command) a collection of computer files including ASCII data files, binary executables, C program sources, and text files. The total size of the input file was 6,594,560 bytes. Five compression methods were tested as indicated in numbered columns 1–5. Numbered column 1 gives the results of a traditional LZW implementation with m=8 and full alphabet dictionary initialization; numbered column 2 gives the results of an empty dictionary initialization, with m=8 and k=0; numbered column 3 gives the results for an intermediate dictionary initialization, with m=8 and k=5; numbered column 4 gives the results of an empty dictionary initialization, with m=16 and k=0; and numbered column 5 gives the results from an intermediate dictionary initialization, with m=16 and k=7.

For each scheme, several dictionary sizes were tried, with maximum output code length varying between 6 and 16 bits as indicated in the far left column. The compression ratio (CR) given for each scheme is measured using the following relationship;

CR=(compressed file size)/(original file size).

Therefore, lower CR numbers indicate better compression performance. It is seen from FIG. 10 that schemes with intermediate initialized dictionaries produce significant compression even if the dictionaries are very small (e.g., b<m) and full initialization is impossible. This is very useful in applications where memory is scarce. Intermediate initializations also outperform full initialization when b is slightly larger than m, and the two schemes are competitive at higher values of b. Intermediate initialization with k>0 almost always outperforms empty initialization.

Using 16-bit input symbols, it is possible to achieve good compression ratios with moderate size dictionaries. The main advantage of 16-bit schemes is that they can double the throughput of a compressor (by processing 16 bits at each compression step, rather than 8), with only a modest increase in memory requirements. Typically, an entry in a LZW dictionary consists of a pointer to a previous entry (or the corresponding code), and a character. Thus, a 16-bit scheme will typically require one more byte per dictionary entry, compared to an 8-bit scheme with the same number of dictionary entries. In addition, when 16 bits is the natural character size (e.g., certain medical imaging applications), best compression is obtained when this character size is maintained.

The initialization scheme described above is advantageous in applications where short blocks of data are compressed independently, (i.e., without sharing dictionary information from one block to the next). One example of such an application is compression of data packets in a local area network (LAN). In the network protocols currently in use in typical LANs, packets range in length from 60 bytes to less than 2048 bytes, and the shorter packets represent a high percentage of the traffic. These are approximate figures. The exact length of a packet depends on how much of the 'envelope' of the packet is taken into account. This in turn depends on the layer of the protocol at which packets are processed.

Run Encoding Enhancement

One of the simplest methods of lossless data compression is run length encoding (RLE). A run is a string of repeated occurrences of the same character in the input (e.g., $a_0, a_1, a_3 \ldots a_{n-1}$), where n is the number of repeated occurrences of the same character "a" in the string. The string $a_0, a_1, a_3 \ldots a_{n-1}$ represent n copies of the same character "a". In RLE, such a run is encoded by sending the character followed by the run length n. For large values of n, the compression ratio for the run is O(log(n)/n). LZ2 schemes also do a good job of compressing long runs. Assuming n is large, the above run would be encoded in a LZ2 scheme as a sequence of codes $A_0, A_1, A_1+1, A_1+2, A_1+3, \ldots, A_1+(k-1)$, $A_2$. $A_0$ is the code for the longest string of a's in the dictionary, $A_1$ is the next available code before the current run is read, $A_2$ is a code to be described below, and k is a non-negative integer.

If the length of the string of a's represented by $A_0$ is $L_0$, then $A_1+(i-1)$ represents a string of $L_0+i$ a's, where, $1<=i<=k$. $A_2$ represents the remaining 'tail' of $L_1$ a's, $0 <= L_1 <= (L_0+k)$, possibly followed by some other characters (if $L_1=0$, the code $A_2$ is not needed as part of the encoded run). The length of the run is $n = L_0 + (L_0+1) + (L_0+2) + \ldots + (L_0+k) + L_1 = L_0(k+1) + k(k+1)/2 + L_1$. It follows that for large n, and a sufficiently large dictionary, the basic LZ2 scheme achieves a compression ratio of $O(\sqrt{n} \, Log(n)/n)$. Therefore, although asymptotically both schemes achieve a zero compression ratio, for bounded inputs, RLE is better suited to compress long runs.

The efficiency of LZ2 for encoding long runs can be improved based on the following observations. When the LZ2 decompressor reads each code in the sequence $A_1, A_1+1, A_1+2, A_1+3, \ldots, A_1+(k-1)$, the code read is the largest possible at that particular time (i.e., the code read is the one just created). Hence, the encoder only needs to send the sequence $A_0, A_1+(k-1), A_2$ for the run of n "a"'s. When the decoder receives the code $A_1+(k-1)$, it detects that this value exceeds the current largest possible code $A_1$, 'learns' that a run is being encoded, and can readily reconstruct the value k and the 'missing sequence' $A_1, A_1+1, A_1+2, \ldots, A_1+(k-2)$. The number of transmitted bits is now $O(\log(k)) = O(\log(n))$, and the compression ratio in the enhanced LZ2 becomes $O(\log(n)/n)$, as in the RLE scheme.

Figure 11:
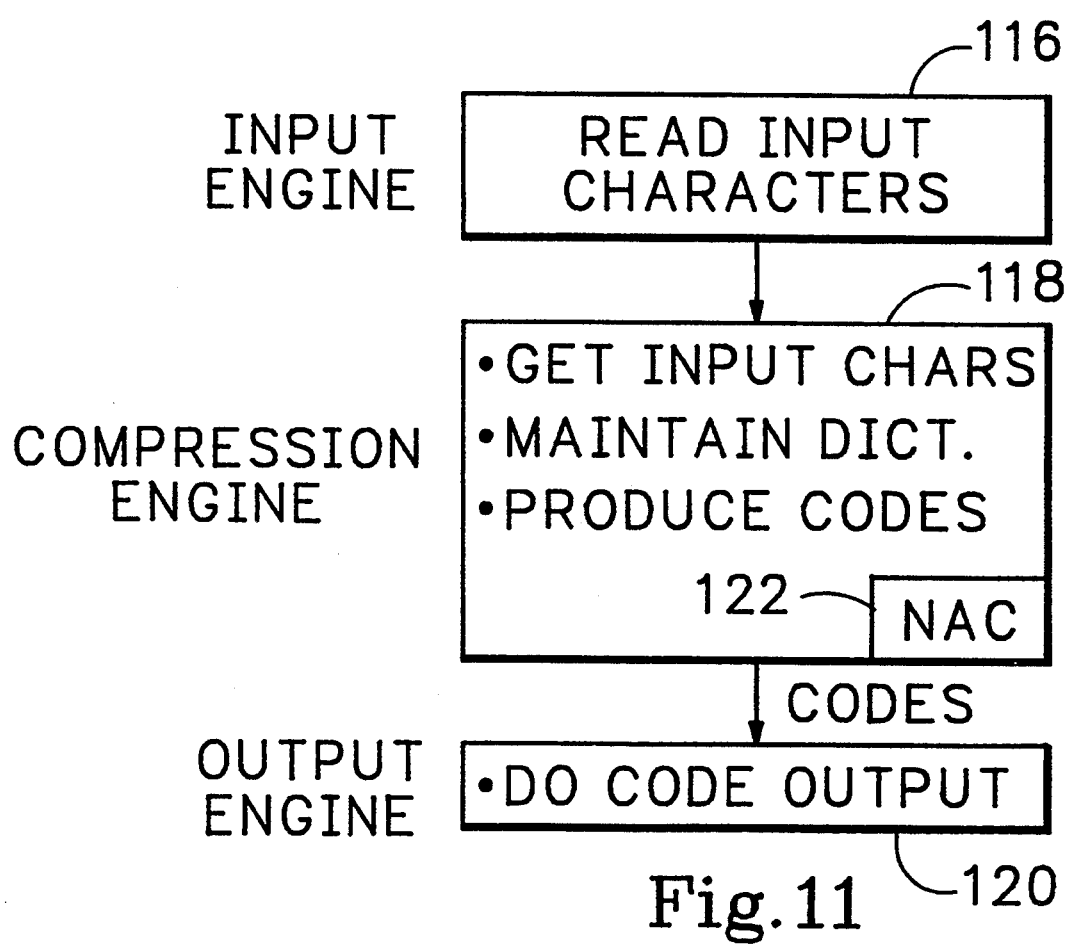
FIG. 11 is a block diagram of a conventional data compression system.

FIG. 11 is a block diagram showing a traditional LZ encoder without run enhancement. An input engine 116 reads characters from an input data stream (not shown) and feeds the input characters to a compression engine 118 (see block 30 in FIG. 1). The compression engine gets the input characters, and builds and maintains a dictionary. For example, the dictionary contains data entries that represent unique input character strings. The compression engine 118 compresses the input data stream and outputs the compressed input data as codewords to an output engine 120. The output engine 120 then either stores the compressed data string for later decompression or transmits the compressed string over a communication channel 28 (FIG. 1) at a reduced bandwidth. The compressed data is decompressed at the opposite end of the communication channel 28, as will be described further in FIG. 15. The compression engine 118 typically maintains an address pointer 122 that identifies the next available code (NAC) where the next unique character string is stored as a data entry in the compression/decompression dictionary. For example, NAC represents the next address location used as a code word for the next unique input character string.

FIG. 12 is a detailed block diagram showing an encoder run enhancement engine according to the invention as shown in FIG. 1. An input engine 124 reads the characters from the input data stream. A compression engine 126 reads the input characters, maintains the dictionary, and produces character codes as described above in FIG. 11. The coded input data is then fed through an encoder run enhancement engine 128 providing a second level of data compression. The compressed codes from the run enhancement engine 128 are fed to an output engine 130 and processed in a manner similar to output engine 120 in FIG. 11.

Run enhancement engine 128 contains a separate address pointer 134 (RUNCODE) that is used in coordination with the NAC address pointer 132 used by compression engine 126. After a character string is encoded by compression engine 126, run enhancement engine 128 intercepts an output code and determines whether it is part of a character run. If the code is determined to be part of a run, the run enhancement engine 128 disables the output engine 130 from outputting some of the codes that contain the characters from the run. Run enhancement engine 128 then generates a run codeword that contains information identifying the untransmitted codes from the run. The run codeword is then output when the end of the run is detected.

Figure 13:
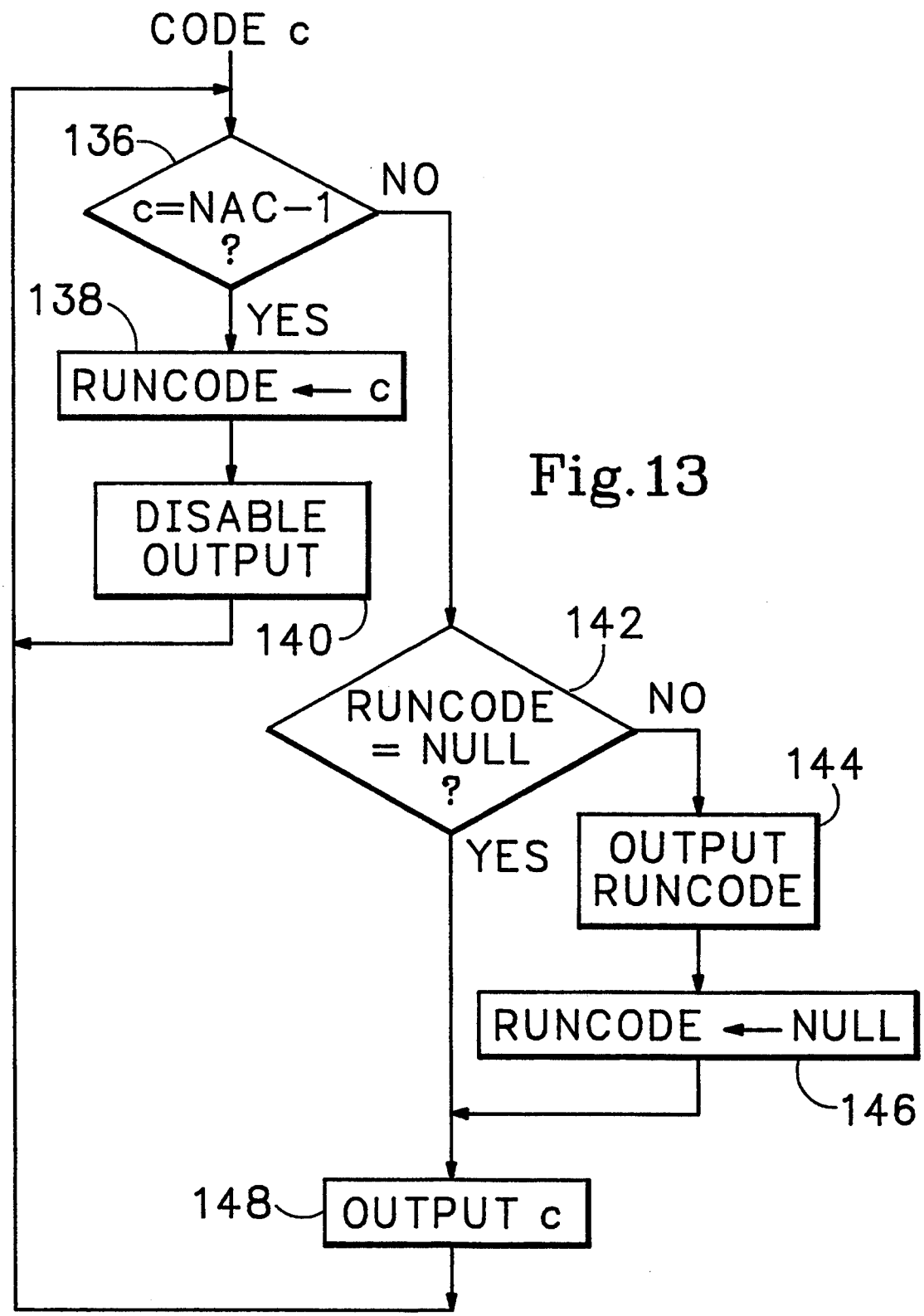
FIG. 13 is a flow chart showing a process for implementing an enhanced Lempel-Ziv run-length encoding method according to the invention.

FIG. 13 is a detailed flow diagram illustrating the process performed by run enhancement engine 128 shown in FIG. 12. A code "C" is queried in block 136 to determine if the code value is equal to the last code created in the dictionary (i.e., NAC-1). When code C is equal to NAC-1, a run has occurred and decision block 136 jumps to block 138, where the code value "C" is written into address pointer RUNCODE. The run enhancement engine then disables output engine 130 (FIG. 12) preventing code C from being output. The process then jumps back to decision block 136 for the next code produced by the compression engine. As long as the following codes represent characters that are comprised within the run (i.e., represent the same characters), the process repeats. For example, RUNCODE is continuously reset to the latest code C value and the output engine is prevented from outputting codewords. Notice that upon return to block 136, the value of NAC will have been incremented by the compression engine.

If a new intercepted code does not equal NAC-1 (i.e., does not equal the last code created in the compression/decompression engine), either no run has occurred or the run has completed. Decision block 136 then jumps to decision block 142, where the value of address pointer RUNCODE is checked. If RUNCODE is a null value then no previous run has occurred and decision block 142 jumps to block 148. Block 148 then outputs code C which is the same as any other non-run encoded character string. The process then returns to decision block 136 for the next code produced by the compression engine. If RUNCODE is not null, a run has previously occurred and decision block 142 outputs RUNCODE as the next code output in block 144. The process jumps to block 146 where RUNCODE is reset to a null value and block 148 then outputs the code C (codeword) value that broke the run. The run enhancement engine then returns to decision block 136 where the next codeword is intercepted from the compression engine.

Figure 14:
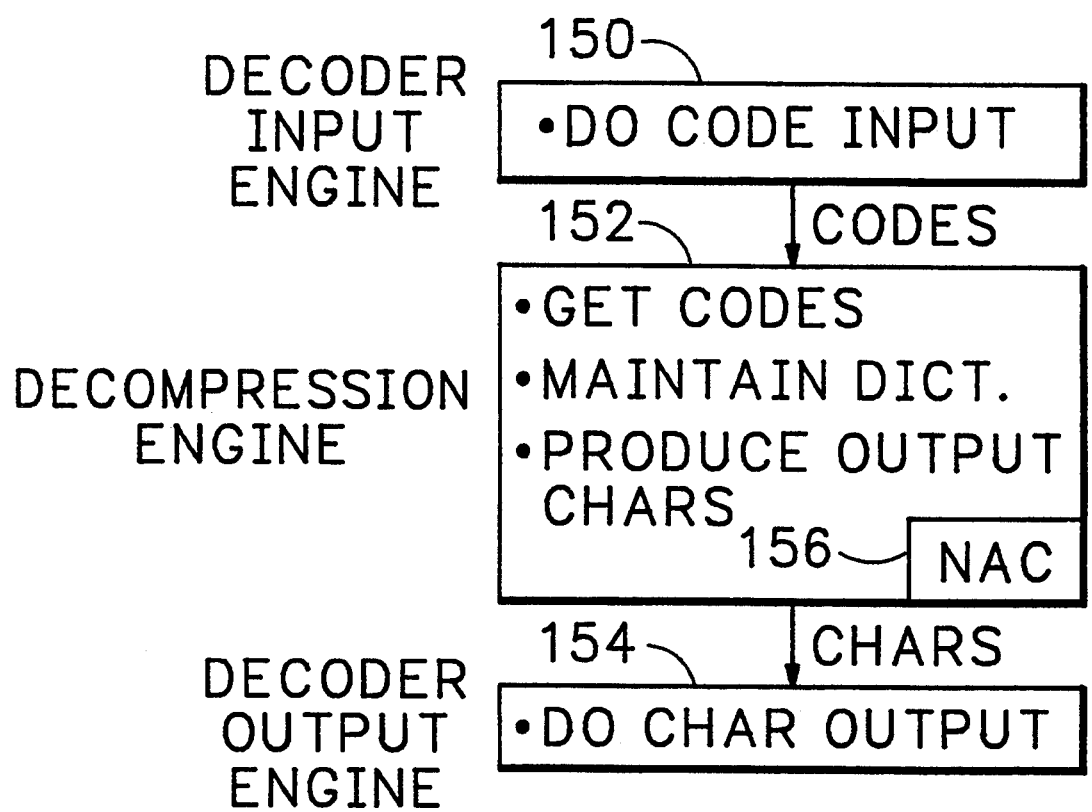
FIG. 14 is a block diagram of a conventional data decompression system.

FIG. 14 is a block diagram of a traditional decompression system. A decoder input engine 150 receives a sequence of compressed character strings represented by codewords and feeds the codewords to a decompression engine 152. The decompression engine 152 gets the codewords, builds and maintains a dictionary, and produces decoded output characters. The next available address (NAC) pointer 156 is maintained in a manner similar to the NAC pointer as described in FIG. 5. A decoder output engine 154 controls the output of decompressed characters from decompression engine 152.

FIG. 15 is a block diagram for a run length enhancement decoder according to the invention. Decoder input engine 158 is the same as decoder input engine 150 in FIG. 15. The codewords from input engine 158 are intercepted in decoder run enhancement engine 160 before being further decompressed in decompression engine 162. Run enhancement engine 160 checks each codeword to determine if it constitutes a run codeword and generates a modified code stream accordingly. If no run code exists, the codeword is fed to decompression engine 162 where normal decompression takes place. Decoder output engine 164 then controls the output of decoded characters from the decompression engine. The decoder run enhancement engine 160 contains an address pointer (RUNCODE) 168 that has access to address pointer (NAC) 166 in decompression engine 162 in a similar manner as shown in FIG. 12.

Figure 16:
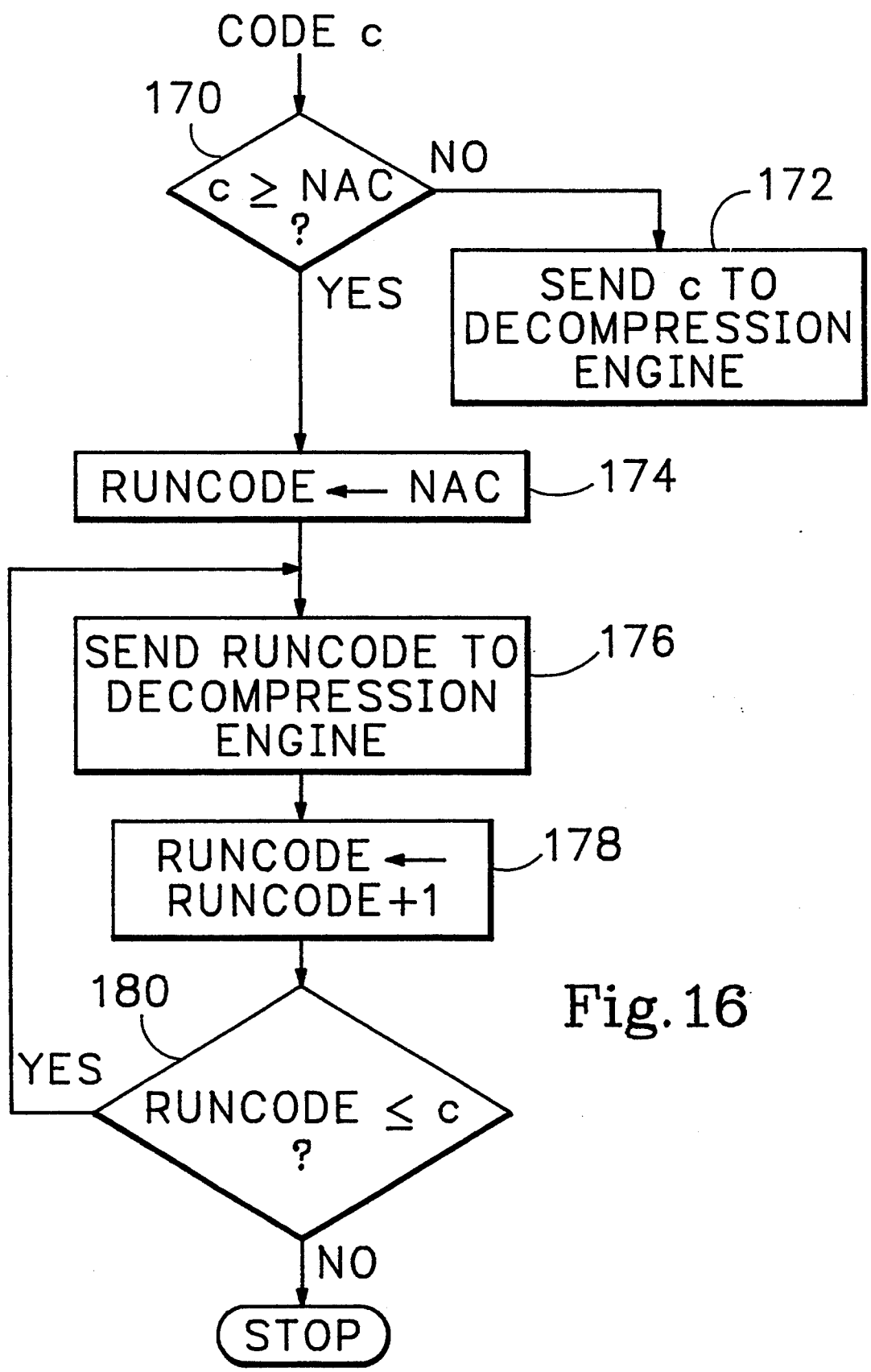
FIG. 16 is a flow chart of the enhanced Lempel-Ziv run-length decoding method according to the invention.

FIG. 16 is a detailed data flow diagram showing the operation of the decoder run length engine 160 in FIG. 15. A code "C" is queried in block 170 to determine if the code value is out of order with what the decompressor is expecting as the next available code address. For example, the decompressor engine, typically, expects code C to be less than the next available code NAC. If the code C is not out of order (i.e., code C<NAC) block 172 sends the value "C" to the decompression engine for processing. If C is out of order (i.e., C≧NAC), the decoder run enhancement engine "fills the gap" between the largest expected code value and the code C value.

Specifically, block 174 writes the value NAC into address pointer RUNCODE and block 176 feeds RUNCODE to the decompression engine as the next codeword for decompression. The value of RUNCODE is incremented in block 178 and decision block 180 determines if the decoder run enhancement engine has "filled the gap" between the output code and the expected next available address (i.e., RUNCODE>C). If the enhancement engine has completed the run decode, decision block 180 indicates the run decompression is completed. If another codeword is needed to "fill the gap" between the run codeword and NAC (i.e., RUNCODE≦C), decision block 180 jumps back to block 176 and the value of address pointer RUNCODE is sent to the decompression engine. RUNCODE is incremented and the process repeated until all the codes in the run have been supplied to the decompression engine.

Figure 17A:
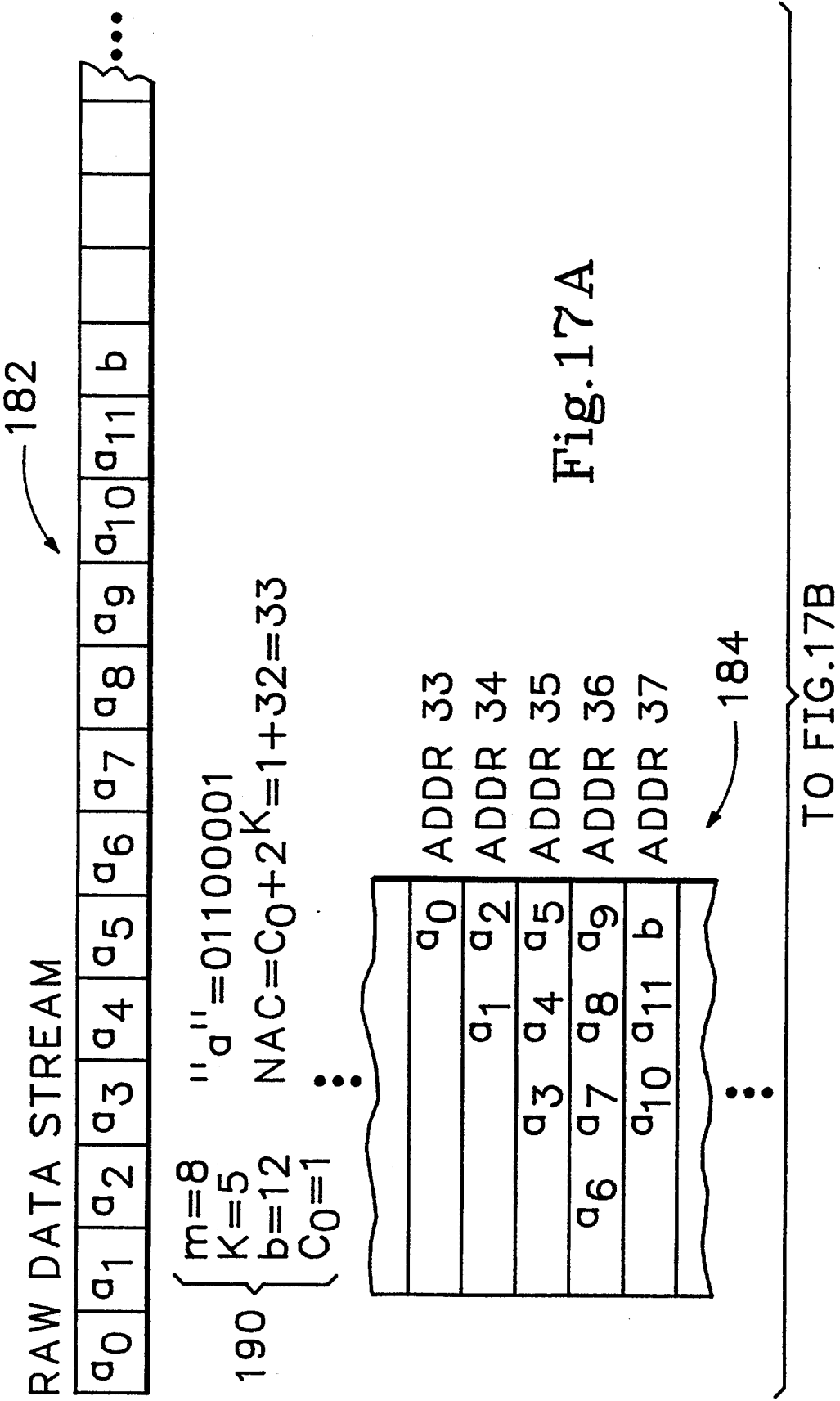

FIG. 17 is an illustration showing how the intermediate initialization process and the run length enhancement process work together. A raw data stream 182 is fed into the data compression engine 30 (FIG. 1) and compressed using the intermediate initialization method illustrated in FIG. 5. Each "a" character in the input data stream 182 is notated with a subscript to help identify its location in the data stream. Thus, $a_0, a_1, \ldots a_{11}$ represent twelve copies of the same char "a". A set of initial operating conditions 190 consist of an 8-bit single character length (m=8), 32 special codes (k=5), a 12-bit fixed length output code (b=12), and a initial starting address of 1 ($c_0$=1). The ASCII representation of "a" in binary notation is [01100001]. The next available code (NAC) is first calculated as NAC=$c_0+2^k$=1+32=33. Memory 184 shows the data entries from the data stream 182 at specific address locations within the compression/decompression dictionary.

The intermediate initialization compression process reads the first input character $a_0$ and searches for a match in memory 184. Assuming that $a_0$ is the first character in the data stream, no match occurs. The character $a_0$ is then stored as a "new character" at address location NAC (ADDR 33), as illustrated in memory 184. The first 5-bits of $a_0$ (i.e., binary [01100]=12) are summed with $c_0$ and output as a first codeword "13" in compressed data stream 186. The partial code for the last three bits of $a_0$ (i.e., binary [001]=1) are then output as the next code word 1. Data stream 186 shows codewords after the compression process with intermediate initialization and data stream 188 shows data stream 186 after the run enhancement process shown in FIG. 13.

The run enhancement process determines that the special character code "13" and the partial character code "1" are not equal to NAC-1, and therefore pass the codes to compressed data stream 188. Address pointer NAC is then incremented (NAC=34). The next input character $a_1$ is read and searched for a matching data entry in memory 184. Since $a_0$ has previously been stored in address location ADDR33, a match occurs, and the next input character $a_2$ is concatenated with $a_1$. Another search is performed searching for the string "aa" (i.e., $a_1, a_2$). This search fails (i.e., no match occurs). Since W is no longer "null" (i.e., W=code($a_1$), the codeword "33" is output by the compression engine 126 (FIG. 12). Run enhancement engine 128 (FIG. 12) intercepts code word "33" to determine if it is equal to NAC-1 (i.e., NAC-1=34−1=33). Code word "33" is equal to NAC-1, therefore, address pointer RUNCODE is set to "33" and the output engine 130 (FIG. 12) is disabled, preventing codeword 33 from being output. The string "$a_1, a_2$" is then stored in address location NAC (ADDR34) and address pointer NAC is incremented (NAC=35).

The next character string that does not match a previously stored data entry in memory 184 is the string [$a_3, a_4, a_5$]. The dictionary entry "aa" (i.e., ADDR34) is then typically output by the compression engine. The run enhancement engine determines that the output code is equal to NAC-1 (i.e., 35−1). Therefore, the value of address pointer RUNCODE is replaced with the present output code value (i.e., RUNCODE=34). The run enhancement engine then disables the output engine, preventing the code word "34" from being output from the compression engine. The compression engine then stores character string [$a_3, a_4, a_5$] in address location NAC (ADDR35) and increments NAC (NAC=36).

The next character string from the raw data stream 182 that does not match a data entry in memory 184 is the character string [$a_6, a_7, a_8, a_9$]. The output code word "35" is then output by the compression engine. Since output code word "35" is equal to NAC-1 (36−1), the value of address pointer RUNCODE is set to the value 35 and the output code word "35" is disabled from being output in compressed data stream 188. Character string [$a_6, a_7, a_8, a_9$] is then stored in address location NAC (ADDR36) and address pointer NAC is incremented (NAC=37). The compression engine then combines additional characters from raw data stream 182 until the sequence [$a_{10}, a_{11}, b$] no longer matches any entry in memory 184. The codeword "34" for the last matching data entry string (i.e., [$a_1, a_2$ at ADDR34) is then output by the compression engine. The run enhancement engine determines that the code word "34" is not equal to NAC-1 (36) (i.e., end of run). Since the value of RUNCODE is "36" (i.e., not null), the RUNCODE value and the codeword "34" are output on compressed data stream 188 (i.e., 36, 34). RUNCODE is then reset to a "null" value. The character string [$a_{10}, a_{11}, b$] is copied into memory location NAC (ADDR37) before NAC is incremented. This process is continued until all characters from raw data stream 182 are compressed.

The data stream 188 is decompressed by first decoding encoded character "13" as shown in FIG. 8. Since the code word "13" is greater than $c_0$ (i.e., "1") and less than $c_0+2^k$ (i.e., "33"), it is processed as a NEW character, as shown in FIG. 9. For example, the next three bits from data stream 188 (i.e., code word "1"), are concatenated with the decoded 5-bit binary representation of special character code "13" (i.e., $13-C_0=12=[01100]$). This generates the ASCII representation of "a" (i.e., [01100001]). The first decoded character is represented as $a_0$ in decompressed data stream 190. The decoded character "a" is then loaded into address location ADDR33 of the decompression dictionary (not shown).

The next encoded character "36" from compressed data stream 188 is determined to be greater than $c_0+2^k$ designating it as a multi-character encoded character string. The encoded character is intercepted by the decoder run enhancement engine 160 (FIG. 16). The code word "36" is compared with the present value of NAC (33). Since the code value "36" is greater than the code value "33", the value of NAC is written into address pointer RUNCODE, and RUNCODE is used as the next encoded character decompressed by the decompression engine. The decompression engine builds the decompression dictionary at address location ADDR34 and outputs characters from the run on decompressed data stream 190 in a manner typical for a LZ2 decompression scheme.

The decoder run enhancement process in FIG. 16 then increments RUNCODE (34) and checks to see if the value of RUNCODE is less or equal to the encoded character value "36". Since the value of RUNCODE is less than "36", the new value of RUNCODE is sent to the decompression engine as the next encoded character. The process is repeated until RUNCODE is equal to the code word value "36". The next code word "34" is then read from compressed data stream 188 and processed in a similar manner by the decoder run enhancement engine. Thus, the gap in codewords in the compressed data stream (i.e., codewords 33, 34, and 35) are filled by the run enhancement engine.

The raw data stream 182 is compressed to a first level by the LZ2 intermediate initialization compression process shown in FIG. 5, and the data is further compressed to a second level by the run enhancement process shown in FIG. 13. It is evident from data stream 188, that the number of codewords transmitted from the run enhancement engine is less than that normally transmitted by data stream 186. Therefore, the compression ratio is first increased by the reduced encoded character bit lengths provided by the intermediate initialization process and further increased by the run enhancement process.

Notice that the run encoding enhancement process does not entail any compression penalty for other types of redundancy in the input data. The enhancement exploits some of the residual redundancy left in the code stream produced by the LZ2 scheme: at any given point in time there is a 'maximum valid code' that can occur in the stream, and values larger than the maximum code are 'illegal'. The run encoding enhancement uses these 'illegal' codes to encode runs. When implementing the run encoding enhancement together with variable length codes: the sequence $A_1, A_1+1, A_1+2, A_1+3, \ldots, A_1+(k-1)$ cannot be allowed to span a code length boundary. For example, the number of bits required to transmit $A_1+(k-1)$ must be the same required to transmit $A_1$ since this is the bit length expected by the decompressor. This can be done by splitting (when necessary) the run into subruns. Several variants of the run encoding enhancement are possible. One such variant would be not to enter the 'new codes' $A_1+1, A_1+2, \ldots, A_1+(k-1)$ in the dictionary. Therefore, dictionary space is saved, while still preserving a way of encoding runs. Which variant performs better will depend on the distribution of run lengths in the input data.

Huffman Coding

Network protocols (e.g., TCP/IP) wrap the actual data packets being transmitted with an envelope of overhead information required to manage network traffic. Empirical observation indicates that this overhead tends to increase significantly the relative frequency of occurrence of null bytes in the network traffic. This phenomenon is due in part to 'zero-padding' of various fields in the packet envelope. The frequency of occurrence of nonzero values depends on the data, and over long periods of time it does not show a marked departure from a uniform distribution. Hence, a rough approximation of the probability distribution on byte values is given by;

$$P(c) = \begin{cases} p & c=0 \\ (1-p)/255 & c \neq 0 \end{cases}$$

where P(c) is the probability of occurrence of a byte with value c, and $0 <= p <= 1$. Values of p obtained by monitoring network traffic typically vary between 0.2 and 0.3. With very short packets, or when the actual packet data is not compressible (e.g., data already compressed at the source), a high probability of zero values is often the only redundancy that is left in the data. In these cases, a simple Huffman encoding scheme will sometimes outperform a LZ scheme.

The basic principle of Huffman coding is to encode fixed length characters with variable length codes, using shorter codes for the most frequent characters, and longer codes for the least frequent ones. Huffman coding is well known in the art and is, therefore, not discussed in detail. Using the Huffman algorithm, it is possible to construct an optimal code assignment for a given probability distribution. The resulting code assignment also has a "prefix free" property (i.e., no code occurs as a prefix of another code). This makes the encoded stream uniquely decipherable and instantaneous.

For the simple probability distribution described above, with $p > 1/256$, and assuming 8-bit input bytes valued between 0 and 255, an optimal Huffman code assignment is given in FIG. 18A. Referring to the center column, "z" is an integer in the range $1 <= z <= 8$, whose optimal value as a function of p is determined in the following manner. The compression ratio for this coding scheme is defined in equation 1 as:

$$R(z,p) = pz/8 + [(1-p)/2040]^* (2^{9-z}+2038) \tag{1}$$

Figure 18B:
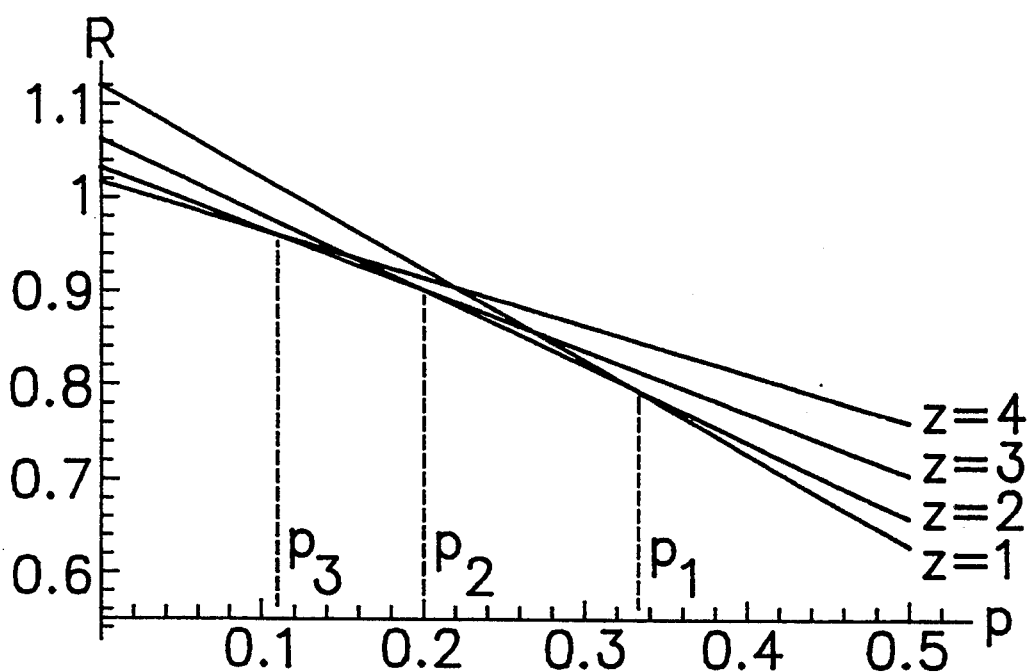
FIG. 18B is a plot of compression ratios for Huffman encoded data.

For a fixed z in the range $1 <= z <= 8$, R(z,p) is a linear function of p. Its slope is nonpositive and monotonically increasing with z. Also, the value R(z,0) decreases monotonically with z. FIG. 18B shows plots of R(z,p) for $1 <= z <= 4$ and $0 <= p <= 0.5$. Hence, for a given z, there exists a value $P_z$ such that $R(z,p) <= R(z',p)$ for all $z' > z$ and $p > p_z$. It can be readily verified that $p_z$ is the root of a linear equation 2, $$R(z,p_z) = R(z+1, P_z). \tag{2}$$

Substituting the expression for R(z,p) in equation 1 into equation 2 and solving for $p_z$, generates the equation, $$P_z = 2^{8-z}/[(255 * 2^z) + 256].$$

FIG. 19 is a table showing the values of $p_z$ for $0 <= z <= 8$. The value $p_z = 1$ for $z = 0$ is included for completeness. A given value of z, $1 <= z <= 8$, is optimal when p is in the range $P_z <= p <= p_{z-1}$. Some of these intervals are shown in FIG. 18B. Thus, $z = 2$ is optimal for $64/319 <= p <= 128/383$ (approximately $0.2006 <= p <= 0.3342$). Note that this range includes the values of p empirically found in typical LAN traffic.

A Compression Scheme for Network Packets

Figure 20:
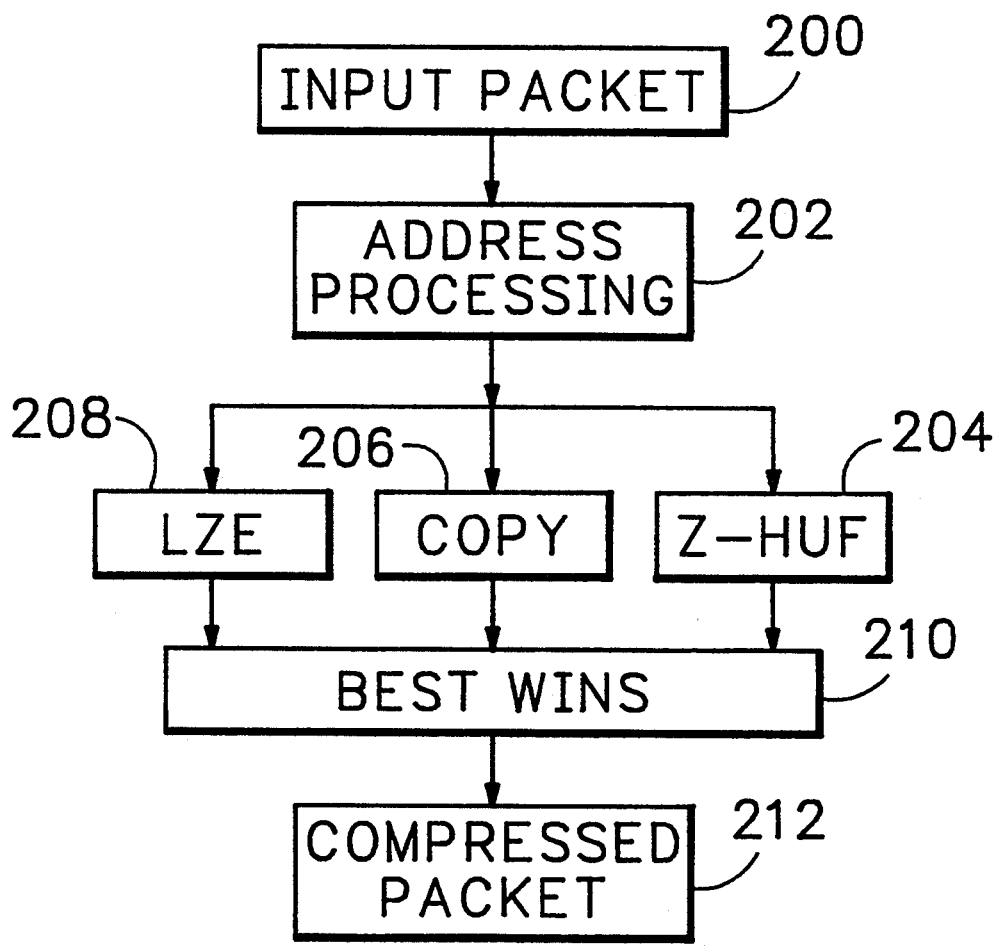
FIG. 20 is a block diagram of a parallel "best wins" compression system according to the invention.

The various compression methods previously described are combined in FIG. 20, to produce an effective scheme for customized compression of network packets. FIG. 20 shows a block 202 for processing the packet address fields (usually, two 6-byte fields). In certain applications (e.g., network bridges), most packets carry addresses from a small subset (namely, the addresses of the stations served by the bridge). These frequently occurring addresses can be stored in a table, and encoded by their serial number in a table. For example, if the address table is 255 bytes long, a serial number can be encoded in one byte, thus achieving a 6:1 compression ratio for the address field (one code is reserved for marking addresses that are not found in the table). In alternative applications, the address fields are compressed together with the rest of the packet, or sent uncompressed.

Referring to FIG. 20, an input packet 200 is fed into an address processing block 202. Block 208 represents an enhanced LZ2 scheme, with intermediate initial dictionary and run encoding enhancement (LZE). Block 204 represents the simple Huffman scheme (Z-HUF) as described previously with $z = 2$. In a hardware implementation, LZE and Z-HUF run in parallel. Block 210 picks the output of the compression method with the best performance for the current packet. Block 210 then outputs the compressed packet together with a short header containing the compressed packet length, and an indicator as to the selected compression method. The length of the compressed output is also compared against the length of the original packet from block 200 to prevent packet expansion. If neither the LZE or the Z-HUF compressor succeeded in compressing the packet, a copy of the original is output from block 206, together with an appropriate indication in the header.

In general, the majority of the packets have a better compression ratio with the LZE in block 208, than with the Z-HUF in block 204 or "Copy" block 206. However, the Z-HUF and "Copy" blocks will win some of the packets (most often, shorter ones). Some representative compression results are presented in FIG. 21 for two different files of packets. The first row in FIG. 21 shows a LZW implementation (UNIX compress), with output codes up to 16 bits. All the packets are compressed as one file (i.e. packet boundaries are ignored, and dictionaries are shared between packets). The second row in the table in FIG. 21 shows the results of an UNIX compress with 12-bit output codes, the third row gives the results from the LZE compression scheme described above, and the fourth row gives the compression results using both the LZE and Z-HUF compression schemes in parallel as shown in FIG. 20. The results in the third and fourth row correspond to compressing each packet independently.

As can be seen in FIG. 21, the compression performance for individual packets is close to, and in some cases even better than, that attainable when compressing large files of packets. This is true even though there is a better chance of adapting to the statistical characteristics of the data source in a large file of packets by exploiting inter-packet redundancy. The compression results in FIG. 21 are consistent with longer term compression tests where a software implementation was allowed to run continuously for several days. The network packets were periodically sampled, compressed, decompressed, and monitored for compression ratio.

Figure 22:
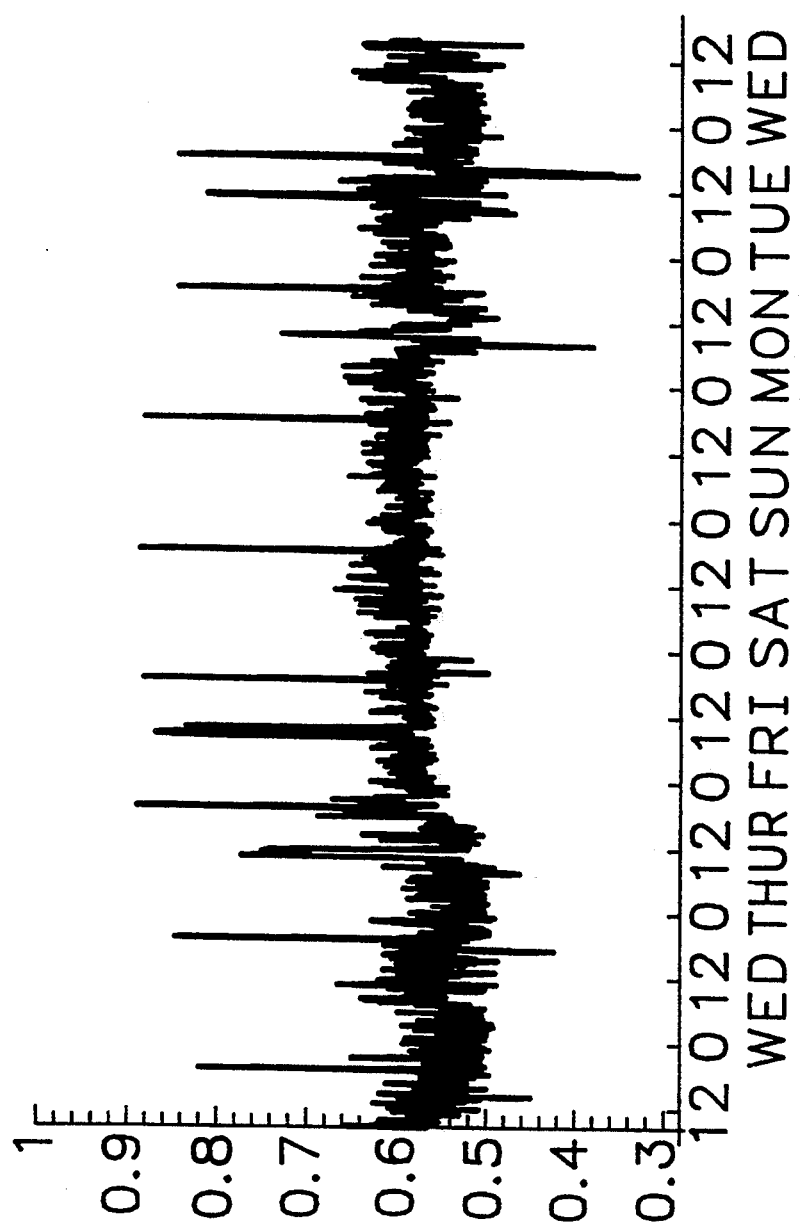
FIG. 22 is a graph of compression ratio vs. time using the system of FIG. 20 on real network packet data.
Figure 23:
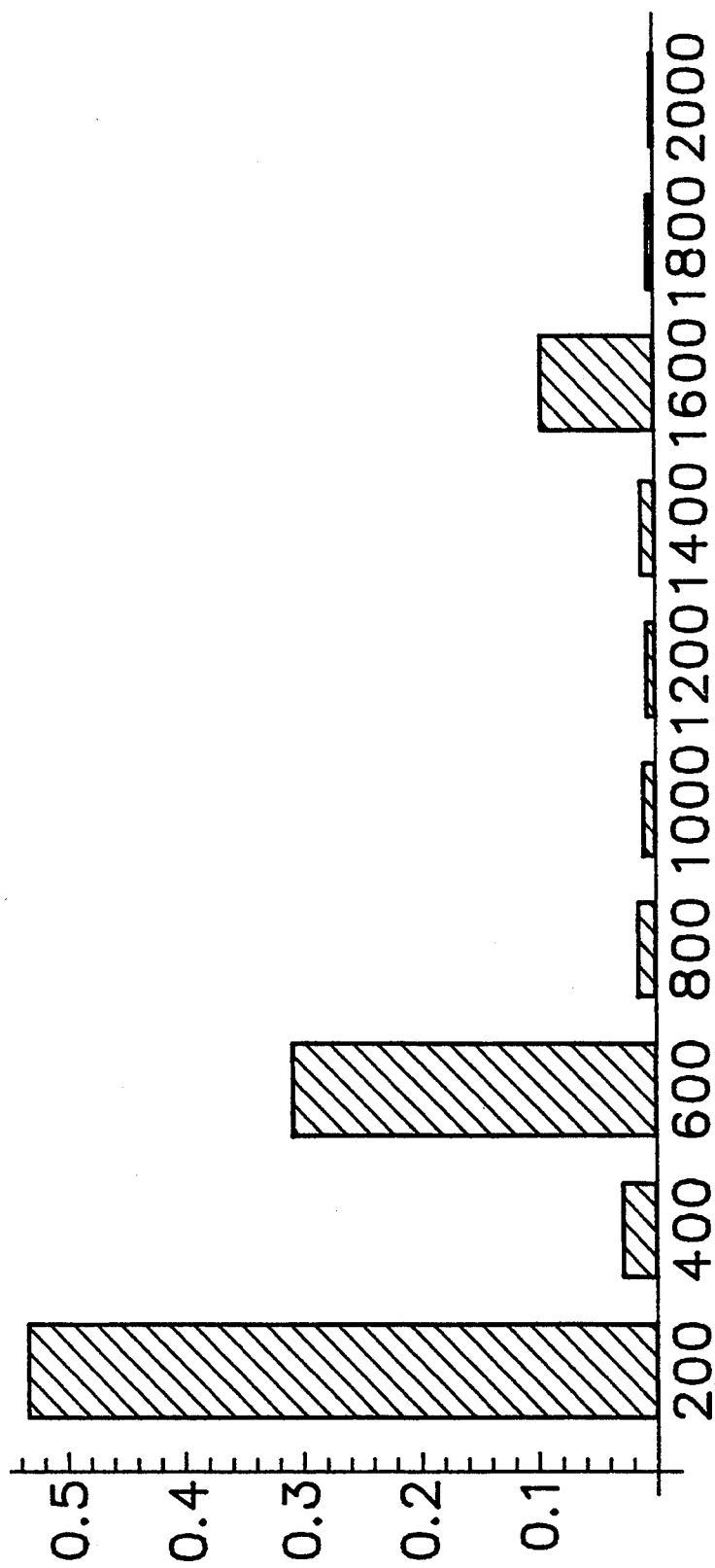
FIG. 23 is a graph showing the distribution of the data in FIG. 22 by packet length.
Figure 24:
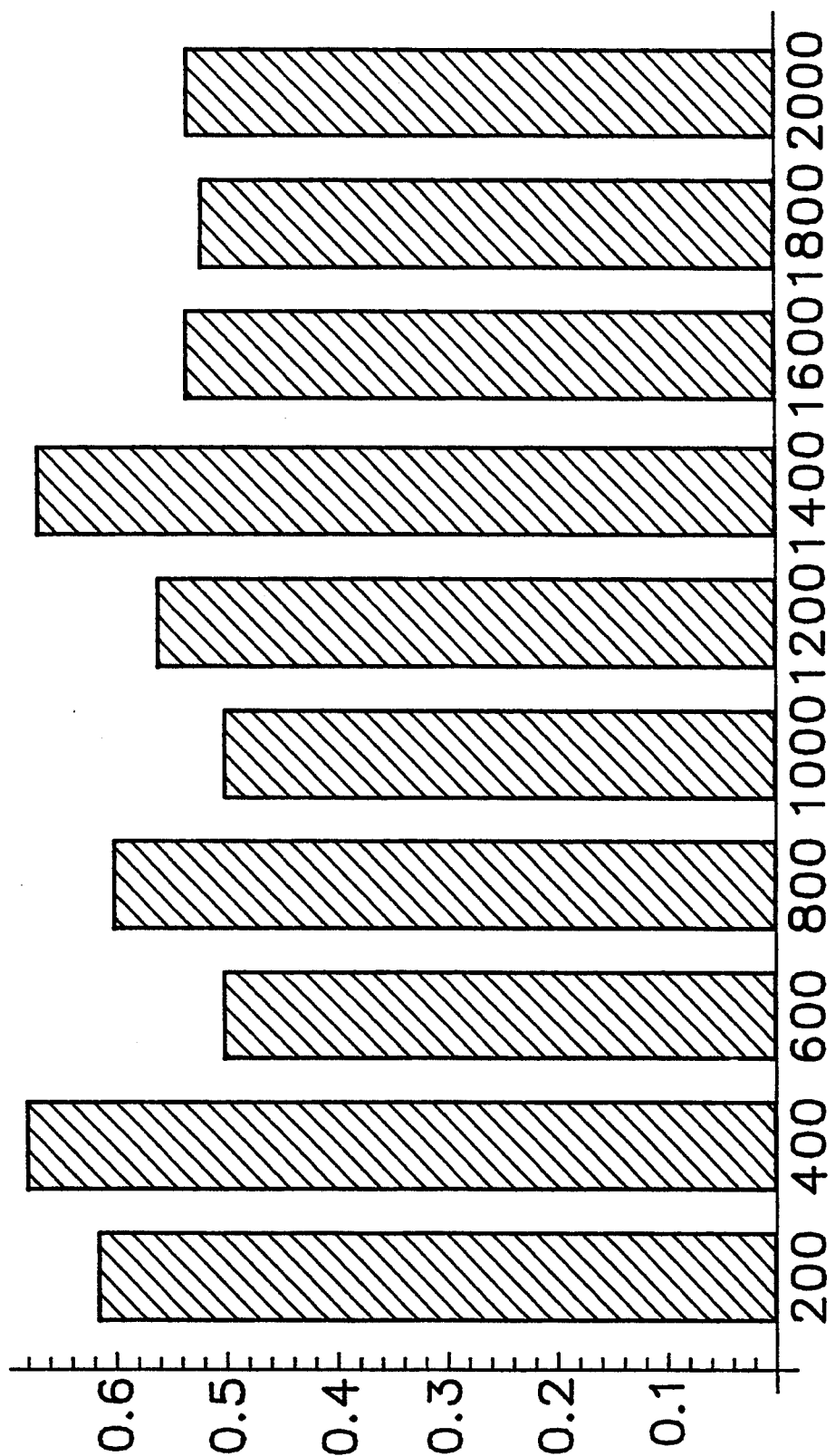
FIG. 24 is a graph of the compression ratio of the data in FIG. 22 as a function of packet length.

FIG. 22 shows a graph of compression ratio as a function of time. Compression was measured for a period of approximately 200 hours. The sampled data set consisted of 1,420,998 packets, with a total size of 198,754,151 bytes, for an average packet length of 140 bytes. The average compression ratio for the data set was 0.572. FIG. 23 shows a histogram of the distribution of data (fraction of the total number of bytes) by packet length. More than 50% of the bytes in this data set are contained in packets of length 200 bytes or less. FIG. 4 shows the average compression ratio for different ranges of packet lengths. A consistently good compression ratio is maintained for each packet length.

The system as described above improves compression performance in data sources where the 'natural' alphabet is large (e.g. 16-bit symbols). In addition, the system improves compression performance for data sources partitioned into short blocks, where each block must be compressed independently. These enhancements provide a compression scheme customized for network packets. Thus, compression performance on individual network packets is now comparable to that attainable with large files of packets, even when the average packet length is very short.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A method for encoding input data in a dictionary based compression/decompression system comprising:

storing unique multiple character strings from the input data as dictionary entries in the compression/decompression system;

encoding multi-character strings from the input data into codewords according to the address of dictionary entries matching the character strings;

identifying single-character strings from the input data that have not previously been stored in the compression/decompression dictionary;

encoding each single-character string into a special code and a partial code, each special and partial code representing a selectable portion of the associated single-character string; and outputting a compressed data stream from the compression/decompression system having both the codewords corresponding to the encoded single-character strings and the codewords corresponding to the encoded multiple character strings, each special code and associated partial code uniquely identifying a single-character string and representing a subset of the total number of unique single-character strings that can exist in the input data.

2. An encoding method according to claim 1 including encoding the special code for each single-character string in the compressed data stream according to a selectable parameter k that determines how many bits of the single character are contained in the special code.

3. An encoding method according to claim 2 including reconstructing single character strings from the compressed data stream, the reconstruction process comprising:
identifying a special code in the compressed data stream;
decoding the special code back into an original portion of the associated single character string; and
combining the special code with its associated partial code.

4. An encoding method according to claim 1 wherein the special code is encoded to exist within a predefined range of code values generated by the compression/decompression system.

5. An encoding method according to claim 1 wherein encoding single-character strings comprise allocating a subset of bits from the single character string to the special code, and allocating the remaining bits from the single character to the partial code, the number of bits in the special code being determined by the number of codewords allotted in the compression/decompression system to represent single character strings.

6. An encoding method according to claim 5 wherein the number of bits assigned to the special codes of the single character strings are changed according to the type and structure of the input data.

7. An encoding method according to claim 1 including detecting a run of consecutive codewords in the compressed data stream, each codeword in the run representing a string of input data made up from the same character.

8. An encoding method according to claim 7 including compressing the run of codewords from the compressed data stream.

9. An encoding method according to claim 7 including disabling the compression/decompression system from outputting part of the codeword run in the compressed data stream.

10. An encoding method according to claim 9 wherein the value of the first codeword sent following the disabled codewords allows for reconstruction of the sequence of disabled codewords.

11. An encoding method according to claim 7 including simultaneously compressing the input data with at least one additional compression scheme and selecting the compressed data stream from the scheme that provides the best compression ratio.

12. An encoding method according to claim 11 including selecting the uncompressed input data characters when the input data size smaller than each compressed data stream.

13. An encoding method according to claim 1 wherein the total number of unique single character strings is larger than the total number of dictionary entries in the compression/decompression system.

14. An encoding method according to claim 1 wherein the number of unique single character strings is $2^{16}$.

15. A method for encoding input data in a dictionary based compression/decompression system comprising:
encoding character strings from the input data and storing unique character strings as data entries in the compression/decompression dictionary;
outputting a compressed data stream from the compression/decompression system, the compressed data stream made up of codewords representing the encoded character strings;
detecting a sequence of codewords in the compressed data stream that represent a run of input data characters, the run representing input data characters having the same value and processed by the compression/decompression system in sequential order; and
compressing the compressed data stream by disabling the compression/decompression system from outputting part of the codeword run in the compressed data stream; the value of the first codeword sent following the disabled codewords allowing for reconstruction of the sequence of disabled codewords.

16. An encoding method according to claim 15 wherein the run is detected by comparing the encoded value output from the compression/decompression system with the memory location of the last data entry stored in the compression/decompression dictionary.

17. An encoding method according to claim 16 including disabling the compression/decompression system from outputting encoded character strings until the last encoded value output from the compression/decompression system no longer equals the address value of the last character string stored in the dictionary.

18. An encoding method according to claim 15 including decompressing the first codeword sent following the disabled codewords into codewords that are further decompressed into decompressed data by the compression/decompression system.

19. A circuit for encoding input data in a dictionary based compression/decompression system comprising:
a compression/decompression engine for encoding single and multiple character strings from the input data into codewords and outputting the codewords as a compressed data stream;
means for separating single-character strings from the input data into first and second code fields;
means for encoding the first code field to identify single-character strings in the compressed data stream, the first code field encoded to be within a predefined range of compression/decompression engine code values; and
means for generating single-character strings from the compressed data stream by decoding the first code field and combining it with the second code field, the first and second code fields reducing the bit-length of encoded character strings by representing a subset of all single-character strings that can possibly occur in the input data.

20. A circuit according to claim 19 wherein the encoding means sums a selectable number of bits from the first code field with a predefined value.

21. A circuit according to claim 19 wherein the decoder subtracts a predefined value from the first code field and combines a selectable number of bits from the result with the second field.

22. A circuit according to claim 19 including an encoder run enhancement engine coupled to the compression/decompression engine for disabling the compression/decompression engine from outputting some of the codewords in the compressed data stream.

23. A circuit according to claim 22 including a decoder run enhancement engine coupled to the compression/decompression engine for reconstructing the sequence of disabled codewords from the value of the first codeword sent following the disabled codewords.

* * * * *